(12) United States Patent
Makiyama et al.

(10) Patent No.: US 7,948,062 B2
(45) Date of Patent: May 24, 2011

(54) SEMICONDUCTOR DEVICE AND METHOD FOR MANUFACTURING SEMICONDUCTOR DEVICE

(75) Inventors: Kozo Makiyama, Kawasaki (JP); Toshihiro Ohki, Kawasaki (JP); Masahito Kanamura, Kawasaki (JP); Toshihide Kikkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 250 days.

(21) Appl. No.: 12/339,695

(22) Filed: Dec. 19, 2008

(65) Prior Publication Data
US 2009/0166815 A1 Jul. 2, 2009

(30) Foreign Application Priority Data

Dec. 28, 2007 (JP) .................................. 2007-341176

(51) Int. Cl.
*H01L 21/00* (2006.01)
*H01L 23/58* (2006.01)

(52) U.S. Cl. ................ 257/640; 438/779; 257/E29.006; 257/E21.088; 257/E21.212

(58) Field of Classification Search .................. 257/640, 257/E29.006, E21.088, 178, 891, E21.212; 438/763, 791, 758, 285, 483, 590, 779
See application file for complete search history.

(56) References Cited

U.S. PATENT DOCUMENTS
2008/0290372 A1   11/2008   Makiyama

FOREIGN PATENT DOCUMENTS
| JP | 2001-77127 A | 3/2001 |
| JP | 2007-311464 A | 11/2007 |
| WO | 2007/091301 A1 | 8/2007 |

OTHER PUBLICATIONS

Japanese Office Action dated Feb. 2, 2010, issued in corresponding Japanese Patent Application No. 2007-341176.

*Primary Examiner* — Thomas L Dickey
*Assistant Examiner* — Nikolay Yushin
(74) *Attorney, Agent, or Firm* — Westerman, Hattori, Daniels & Adrian, LLP

(57) ABSTRACT

A semiconductor device including a compound semiconductor laminated structure having a plurality of compound semiconductor layers formed over a semiconductor substrate, a first insulation film covering at least a part of a surface of the compound semiconductor laminated structure, and a second insulation film formed on the first insulation film, wherein the second insulation film includes more hydrogen than the first insulation film.

18 Claims, 14 Drawing Sheets

US 7,948,062 B2

SEMICONDUCTOR DEVICE AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2007-341176, filed on Dec. 28, 2007, the entire contents of which are incorporated herein by reference.

BACKGROUND OF THE INVENTION

1. Field

The Present Invention Relates to a Semiconductor device and a method for manufacturing the semiconductor device.

2. Description of the Related Art

As illustrated in FIG. 1, in a semiconductor device, particularly, in a compound semiconductor device (Schottky gate FET) used for a high power usage, a pair of an ohmic electrode 102 and a gate electrode 103 are, for example, formed on a surface of a compound semiconductor laminated structure 101 in which an implantation area 100 is provided by a method such as an ion implantation, and an active area is fixed. An insulation film (for example, a silicon nitride film) 104 is formed so as to cover the surface of the compound semiconductor laminated structure 101 and the ohmic electrode 102.

The performance (including the reliability) of such a compound semiconductor device for high power usage largely depends on a condition of a boundary (a contacting boundary of semiconductor surface/insulation film) between the surface of the compound semiconductor laminated structure 101 and the insulation film 104 and nature of the insulation film 104 itself covering the surface of the compound semiconductor laminated structure 101.

For example, in the compound semiconductor device for high power usage, the insulation film 104 covering the surface of the compound semiconductor laminated structure 101 contacts to the gate electrode 103. Thus, a high electric field is impressed to the insulation film 104, and leak current is flowed from the gate electrode 103 to inside of the compound semiconductor laminated structure 101 through the insulation film 104. The life (reliability) of a device is influenced by this leak current. Many studies have been executed for a high-quality surface protection insulation film and to improve the life (reliability) of the device, or the like.

Additionally, the performance, which is requested for the insulation film (for example, the silicon nitride film) for the compound semiconductor device for protecting a compound semiconductor surface, includes two points of a stabilizing action for the compound semiconductor surface, and a favorable insulation characteristic of the insulation film itself.

Here, the stabilizing action for the compound semiconductor surface means such an action that, by forming the insulation film on the compound semiconductor surface, a chemical change phenomenon on the compound semiconductor surface is suppressed, and the accompanying change of surface electric potential because of the chemical change phenomenon is suppressed.

For example, the insulation film, which is excellent for the stabilizing action for the compound semiconductor surface, means the insulation film includes a lot of hydrogen (H)-terminated bond, and the like in the insulation film. Such an insulation film includes a large chemical action for the compound semiconductor surface, and in some cases, such an action is expected that an instable atomic coupling condition on the compound semiconductor surface is returned to a normal condition.

On the other hand, the favorable insulation characteristic of the insulation film itself means such a characteristic that the leak current flowed in the insulation film is small even when the high electric field is impressed. Particularly, in a SiN film, the leak current in the film is largely changed according to a chemical coupling condition between a silicon (Si) atom and a nitrogen (N) atom.

For example, the insulation film, whose insulation characteristic is favorable, means the insulation film in which every coupling arm in the insulation film is used. Since current flowed in the insulation film is very small, it is possible to suppress the leak current through the insulation film, and to reduce the change of film quality because of the current flowing in the insulation film.

However, if the stabilizing action by the insulation film for the compound semiconductor surface is not enough, the device characteristic, such as current fluctuation when the device is operated, is influenced.

If the favorable insulation characteristic of the insulation film itself is not obtained, the leak current is flowed, and the performance of the compound semiconductor device is degraded.

It is essentially difficult from a viewpoint of a chemical coupling of the insulation film to combine the two points that the stabilizing action by the insulation film for the compound semiconductor surface is improved, and the favorable insulation characteristic of the insulation film itself is obtained.

SUMMARY

According to an aspect of the invention, a semiconductor device includes a compound semiconductor laminated structure including a plurality of compound semiconductor layers formed over a semiconductor substrate, a first insulation film covering at least a part of a surface of the compound semiconductor laminated structure, and a second insulation film formed on the first insulation film, wherein the second insulation film includes more hydrogen than the first insulation film.

DESCRIPTION OF THE PREFERRED EMBODIMENTS

First Embodiment

Figure 2:
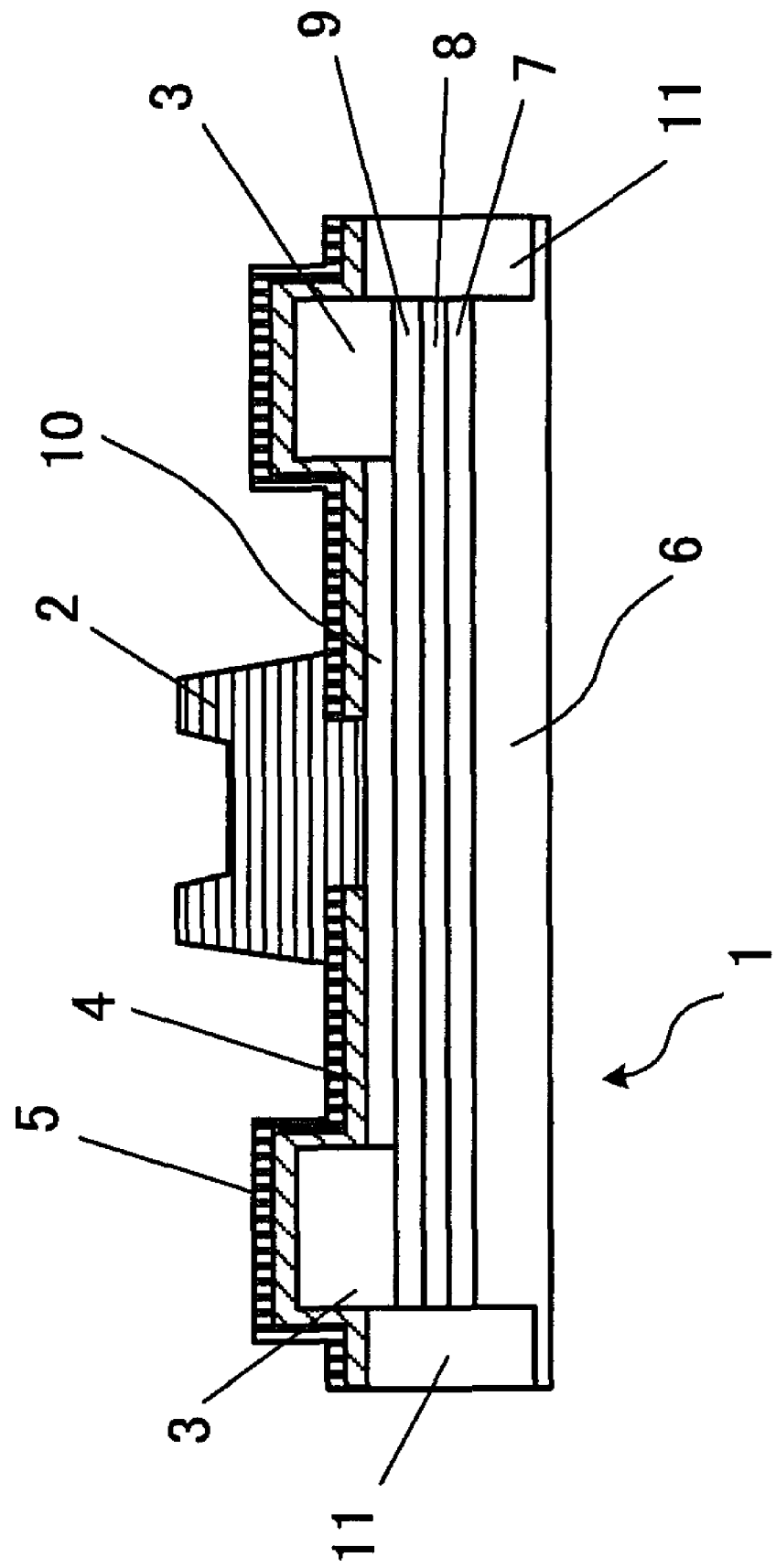
FIG. 2 is a pattern cross-section view illustrating a configuration of a semiconductor device according to a first embodiment of the present invention.

In a semiconductor device according to the present embodiment, a compound semiconductor device includes a compound semiconductor, particularly a Schottky-type Field Effect Transistor (FET) will be described. As illustrated in FIG. 2, the semiconductor device is, for example, provided with a compound semiconductor laminated structure 1 including a plurality of compound semiconductor layers 7 to 10 laminated on a semiconductor substrate 6, a gate electrode 2 Schottky-contacting with the compound semiconductor laminated structure 1, a pair of ohmic electrodes 3 ohmic-contacting with the compound semiconductor laminated structure 1, a first insulation film 4 covering an exposed part of the compound semiconductor laminated structure 1, and a second insulation film 5 formed on the first insulation film 4.

Here, the semiconductor substrate 6 is, for example, a semi-insulating SiC substrate 6. The compound semiconductor layers 7 is, for example, a buffer layer 7, the compound semiconductor layers 8 is, for example, a GaN carrier transport layer 8, the compound semiconductor layers 9 is, for example, an AlGaN carrier supply layer 9, and the compound semiconductor layers 10 is, for example, a GaN surface layer (cap layer) 10. A pair of the ohmic electrodes 3 are used as a source electrode or a drain electrode. Meanwhile, in FIG. 2, reference numeral 11 denotes an element isolation area.

As illustrated in FIG. 2, the first insulation film 4 is an insulation film whose insulation is excellent, and is formed so as to contact with at least a part exposed on a surface of the compound semiconductor layer (here, the GaN surface layer 10) configured in the compound semiconductor laminated structure 1.

Here, the first insulation film 4 is, for example, a silicon nitride film (SiN film).

In the present embodiment, the SiN film as the first insulation film 4 is configured as the insulation film whose insulation is excellent, that is, a stoichiometry insulation film in which a total obtained by adding the number of Si—H couplings and the number of N—H couplings is small (the total density obtained by adding the density of the Si—H coupling and the density of the N—H coupling is low), and a stoichiometric proportion is balanced (an N/Si ratio is 4/3).

A refraction index (refraction index for light with a wavelength of 633 nm) of this first insulation film 4 is 2.0 or in a range around 2.0 (that is, a range of more than 1.9 and less than 2.1). That is, the first insulation film 4 is configured as the insulation film whose refraction index is nearly positioned at the stoichiometry.

Figure 3:
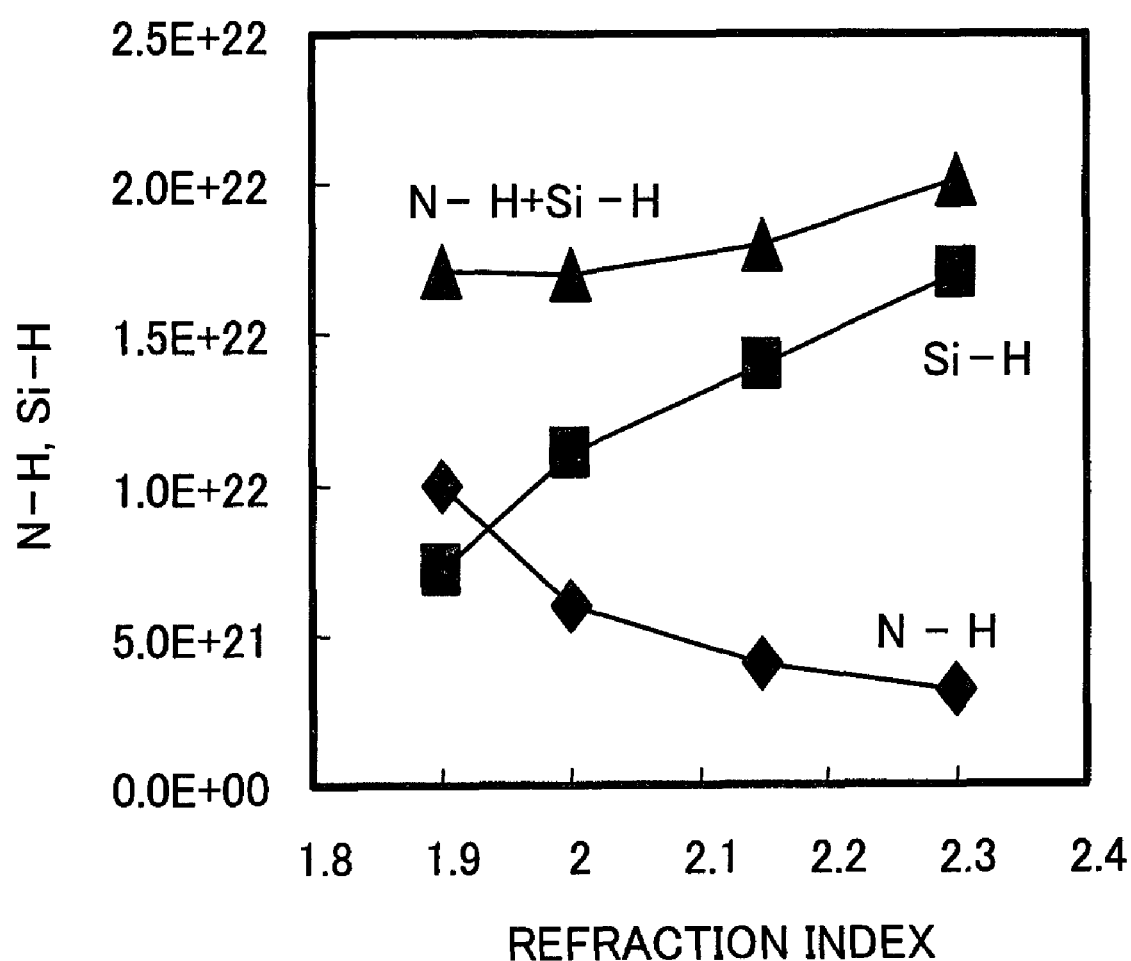
FIG. 3 is a diagram illustrating a relation between Si—H coupling density and N—H coupling density (parts/cm$^3$) which are included in a SiN film which is formed by supplying N$_2$ as N material gas in the high frequency plasma CVD method, and a refraction index.

Here, FIG. 3 is a diagram illustrating a relation between the Si—H coupling density and the N—H coupling density (parts/cm$^3$) which are included in a SiN film which is formed by supplying $N_2$ as material gas in the high frequency plasma CVD method, and a refraction index.

In the present embodiment, for the configuration of the first insulation film 4 as the stoichiometry insulation film, the refraction index (refraction index for light with a wavelength of 633 nm) of the first insulation film 4 is caused to be in a range of more than 1.9 and less than 2.1. Thus, as illustrated in FIG. 3, the density of the Si—H coupling included in the first insulation film 4 is $1.1 \times 10^{22}$ parts/cm$^3$ or in a range around such a value (here, a range of more than $7.0 \times 10^{21}$ parts/cm$^3$ and less than $1.3 \times 10^{22}$/cm$^3$). The density of the N—H coupling included in the first insulation film 4 is $6.0 \times 10^{21}$ parts/cm$^3$ or in a range around such a value (here, a range of more than $5.0 \times 10^{21}$ parts/cm$^3$ and less than $1.0 \times 10^{22}$ parts/cm$^3$).

The total density (in FIG. 3, Si—H+N—H) obtained by adding the density of the Si—H coupling and the density of the N—H coupling included in the first insulation film 4 is $1.7 \times 10^{22}$ parts/cm$^3$ or in a range around such a value. That is, the first insulation film 4 is a low hydrogen including insulation film in which the total density obtained by adding the density of the Si—H coupling and the density of the N—H coupling is low, and only a little hydrogen is included. Meanwhile, the total density obtained by adding the density of the Si—H coupling and the density of the N—H coupling included in the SiN film becomes a minimum value when the refraction index is 2.0.

As described above, in the first insulation film 4 configured as the stoichiometry insulation film, the coupling condition is rarely weak, and an amount of ion contributing to electric conduction is small, so that the first insulation film 4 includes excellent insulation. Thus, the first insulation film 4 blocks a leak current path from the gate electrode 2 to the compound semiconductor laminated structure 1.

As illustrated in FIG. 2, the second insulation film 5 is the insulation film, whose stabilizing action is excellent for the compound semiconductor surface, and which is formed so as to contact with the surface of the first insulation film 4.

Here, the second insulation film 5 is a second silicon nitride film (SiN film).

In the present embodiment, the SiN film as this second insulation film 5 is configured as an insulation film whose stabilizing action is excellent for the compound semiconductor surface, that is, a non-stoichiometry insulation film in which the total obtained by adding the number of the Si—H couplings and the number of the N—H couplings is large (the total density obtained by adding the density of the Si—H coupling and the density of the N—H coupling is high), and the stoichiometric proportion is deviated (the N/Si ratio is deviated from 4/3).

The refraction index (refraction index for light with a wavelength of 633 nm) of this second insulation film 5 is outside 2.0 or a range around 2.0 (that is, a range of more than 1.9 and less than 2.1). That is, the second insulation film 5 is configured so that the refraction index is deviated from the stoichiometry.

In this case, a method for causing the refraction index of the second insulation film 5 to be outside 2.0 or a range around 2.0 includes a method for causing the refraction index of the second insulation film 5 to be higher than 2.0 or a range around 2.0, and a method for causing the refraction index of the second insulation film 5 to be lower than 2.0 or a range around 2.0.

When the refraction index is caused to be higher than 2.0 or a range around 2.0, the Si—H couplings included in the second insulation film 5 are increased, and the second SiN film 5 includes a lot of hydrogen which can generate a chemical action for the compound semiconductor surface.

On the other hand, when the refraction index is caused to be lower than 2.0 or a range around 2.0, the N—H couplings included in the second insulation film 5 are increased, and the second insulation film 5 includes a lot of hydrogen which can generate the chemical action for the compound semiconductor surface.

As described above, when the refraction index of the second insulation film 5 is outside 2.0 or a range around 2.0, the second insulation film 5 includes a lot of hydrogen which can generate the chemical action for the compound semiconductor surface.

However, since coupling energy of the N—H coupling is more than coupling energy of the Si—H coupling, it is advantageous from a view point of the reactive character that more Si—H couplings are included.

Thus, it is preferable that the refraction index of the second insulation film 5 is caused to be higher than 2.0 or a range around 2.0.

In the present embodiment, to configure the second insulation film 5 as the non-stoichiometry insulation film, the refraction index (refraction index for light with a wavelength of 633 nm) of the second insulation film 5 is caused to be outside a range of more than 1.9 and less than 2.1 (here, equal to or more than 2.1). Thus, as illustrated in FIG. 3, the density of the Si—H coupling included in the second insulation film 5 is outside $1.1 \times 10^{22}$ parts/cm$^3$ or a range around such a value (here, equal to or more than $1.3 \times 10^{22}$ parts/cm$^3$). The density of the N—H coupling included in the second insulation film 5 is outside $6.0 \times 10^{21}$ parts/cm$^3$ or a range around such a value (here, equal to or less than $5.0 \times 10^{21}$ parts/cm$^3$).

The total density (in FIG. 3, Si—H+N—H) obtained by adding the density of the Si—H coupling and the density of the N—H coupling included in the second insulation film 5 is equal to or more than $1.8 \times 10^{22}$ parts/cm$^3$ (preferable, equal to or more than $2.0 \times 10^{22}$ parts/cm$^3$). That is, the second insulation film 5 is a high hydrogen including insulation film in which the total density obtained by adding the density of the Si—H coupling and the density of the N—H coupling is high, and a lot of hydrogen is included. As described above, the second insulation film 5 is configured as the insulation film in which more hydrogen is included than that of the first insulation film 4.

In the second insulation film 5 configured above, a lot of hydrogen is included, such a hydrogen is coupled with Si or N, and chemical stability is degraded as compared with the stoichiometry insulation SiN film ($Si_3N_4$ film) whose N/Si ration is 4/3. As such, the second insulation film 5 does not have a balanced stoichiometry.

Meanwhile, here, based on the above consideration, while the refraction index of the second insulation film 5 is caused to be higher than 2.0 or a range around 2.0, the refraction index is not limited to the above value, and the refraction index may be caused to be lower than 2.0 or a range around 2.0 (that is, equal to or less than 1.9). In this case, the density of the N—H coupling included in the second insulation film 5 becomes equal to or more than $1.0 \times 10^{22}$ parts/cm$^3$ (outside $6.0 \times 10^{21}$ parts/cm$^3$ or a range around such a value). The density of the Si—H coupling becomes equal to or less than $7.0 \times 10^{21}$ parts/cm$^3$ (outside $1.1 \times 10^{22}$ parts/cm$^3$ or a range around such a value). In addition, the total density (in FIG. 3, Si—H+N—H) obtained by adding the density of the Si—H coupling and the density of the N—H coupling becomes larger than $1.7 \times 10^{22}$ parts/cm$^3$ or a range around such a value (preferably, equal to or more than $2.0 \times 10^{22}$ parts/cm$^3$).

By the way, a lot of oxides of a crystal organization element and a lot of bonds which are hydrogen-terminated and are hydroxyl-terminated are included on the compound semiconductor surface.

When the above first insulation film 4 is formed on such a compound semiconductor surface, and the second insulation film 5 is formed on such a first insulation film 4, hydrogen included in the second insulation film formed on the first insulation film is diffused on the compound semiconductor surface because of thermal energy, and the like while the film is being formed. Radical hydrogen included in a reacting furnace while the film is being formed is passed through the first insulation film 4 to be diffused on the compound semiconductor surface. Because of the above, since the radical hydrogen is, for example, reacted with oxygen on the compound semiconductor surface, the radical hydrogen induces a dehydration reaction, and is reacted with hydrogen or hydroxyl on the compound semiconductor surface.

Since such a reaction is processed, an instable element coupling condition on the compound semiconductor surface is stabilized, so that as compared with such a case that the second insulation film 5 is not provided (that is, such a case that a lot of oxides and bonds are included), a chemical change phenomenon on the compound semiconductor surface and an accompanying change of surface electric potential while a device is operating are suppressed, and the device characteristic can be improved.

When a film thickness of the second insulation film 5 becomes larger, leak current may be flowed in the film, so that it is desirable to maintain the insulation performance as a whole that the film thickness of the second insulation film 5 is caused to be small to the extent that the compound semiconductor surface can be reformed. This film thickness is different according to semiconductor material and the degree of denaturalization.

As described above, in the present embodiment, as a protection film covering the surface of the compound semiconductor laminated structure 1, an insulation film with a double-layer structure is provided, which is obtained by laminating the insulation films whose natures are different from each other. That is, as illustrate in FIG. 2, in a side of the compound semiconductor, as the first insulation film 4, the stoichiometry insulation film is provided, whose insulation is excellent, and in a side of the surface, as the second insulation film 5, the non-stoichiometry insulation film is provided, whose stabilizing action is excellent for the compound semiconductor surface. Thus, the high-performance semiconductor device is realized, in which both of the following items can be realized at the same time: the insulation of the insulation film is improved (gate leak current is lowered); and the chemical stability of the compound semiconductor surface is improved, and the device characteristic is improved and the device performance fluctuation is suppressed.

Such a configuration is found based on the following consideration.

The bond is included on the compound semiconductor surface of the compound semiconductor device, which is represented by a trap, or the like, and whose coupling condition is instable.

For example, depending on the kind of crystal, in many cases, the compound semiconductor surface is covered by the oxide of the crystal organization element. This oxide may act as a trap for an electron, and degrades the device characteristic.

For example, the following conditions are also assumed: the compound semiconductor surface is not oxidized and a coupling arm is cut off; or the compound semiconductor surface is terminated by hydrogen (H). Even in this case, like such a case that the oxide is formed, the compound semiconductor surface acts as the trap for the electron, and the device characteristic is degraded.

In this case, to dissolve the instable condition and improve the device characteristic, it can be considered that the non-stoichiometry insulation film (for example, the SiN film including a lot of the Si—H couplings and the N—H couplings) is used as the insulation film formed on the compound semiconductor surface.

By using the non-stoichiometry insulation film, the unused coupling arm is transited to the energy-stable condition in such a system that all the coupling arms are not coupled. It is considered that this transition causes the compound semiconductor surface to be stable. It is considered that a lot of hydrogen (H) included in such a non-stoichiometry insulation film, and the radical hydrogen (radical H) while the film is forming reach the compound semiconductor surface to change the compound semiconductor surface to be stable.

As a result, the chemical change phenomenon on the compound semiconductor surface and the accompanying change of the surface electric potential while the device is operating are suppressed, and the device characteristic can be improved.

However, in such a non-stoichiometry insulation film (SiN film), since the coupling arm of an atom is not stably coupled, the insulation performance is low, and a leak current is likely to flow. For example, when a MIM capacitor is formed by using such an insulation film (SiN film), current flows through the insulation film.

Here, in the Schottky gate-type compound semiconductor device, the gate electrode is Schottky-junctioned on the surface of the compound semiconductor laminated structure. Meanwhile, in the certain gate impressed voltage or less, current flowed through the Schottky-junction is very small.

However, when high voltage is, for example, impressed to the insulation film, the leak current path may be formed from the gate electrode to the compound semiconductor laminated structure through the insulation film.

An amount of the gate leak current flowed in this leak current path influences the reliability of the device.

Under consideration of the above point, to improve the reliability by suppressing the gate leak current, it is considered to use the insulation film, whose stoichiometric proportion is correct (stoichiometry insulation film).

However, the stoichiometry insulation film is extremely chemically stable, and the above stabilizing action (reforming action) for the compound semiconductor surface can be hardly expected.

Figure 4A:
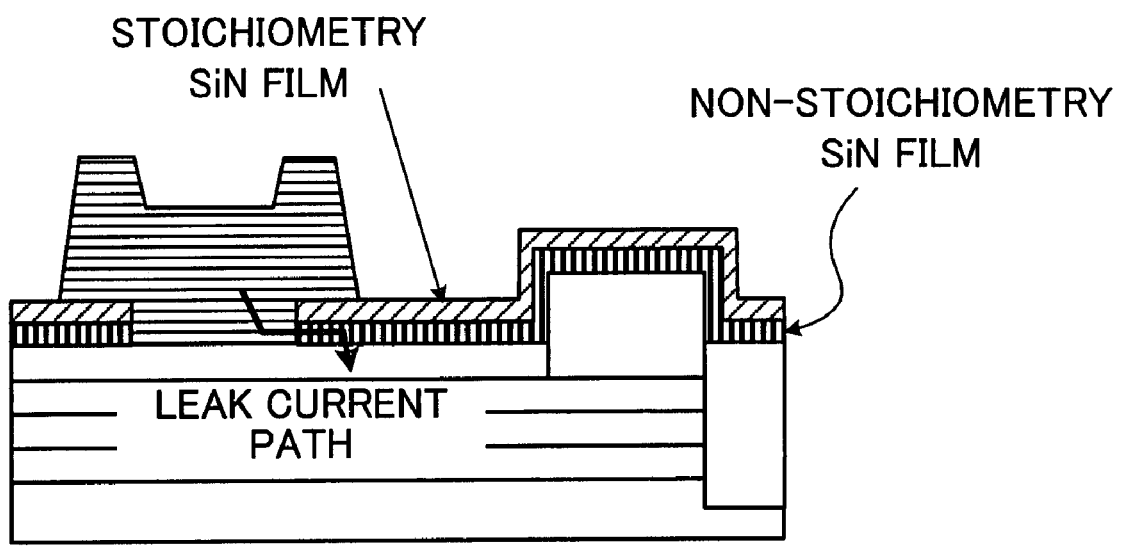
FIGS. 4A and 4B are pattern cross-section views describing a problem of the semiconductor device according to the first embodiment of the present invention.
Figure 4B:
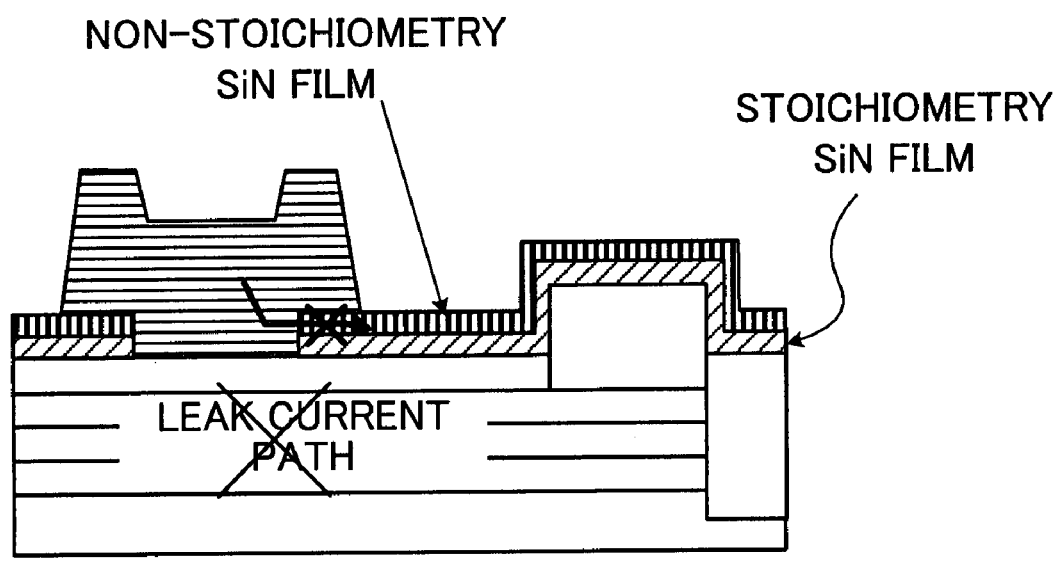

Thus, as illustrated in FIGS. 4A and 4B, to realize both of the following items at the same time; the device characteristic is improved because of the stabilizing action (reforming action) for the compound semiconductor surface; and the gate leak current is lowered, it is considered to organize a double layered structure of the non-stoichiometry insulation film (SiN film) and the stoichiometry insulation film (SiN film).

However, as illustrated in FIG. 4A, for example, when the stoichiometry insulation SiN film is arranged on a surface side, and the non-stoichiometry insulation SiN film is arranged on a side of the compound semiconductor, as illustrated by an arrow in FIG. 4A, a leak current path is formed. Generally, a large electric field is concentrated in this part, and the current easily flows. When the current flows in this part, the inside of the insulation film and a contacting part between the insulation film and the compound semiconductor may be broken. Because of this breaking, the device may be broken.

On the other hand, as illustrated in FIG. 4B, when the non-stoichiometry insulation SiN film is arranged on the surface side, and the stoichiometry insulation SiN film is arranged on the side of the compound semiconductor, the leak current path is not formed.

Under consideration of the above point, the stoichiometry insulation film, whose insulation is excellent, is provided as the first insulation film 4 on the side of the compound semiconductor, and the non-stoichiometry insulation film, whose stabilizing action is excellent for the compound semiconductor surface, is provided as the second insulation film 5 on the surface side.

Next, a method for manufacturing the semiconductor device of the present embodiment will be described.

Figure 5A:
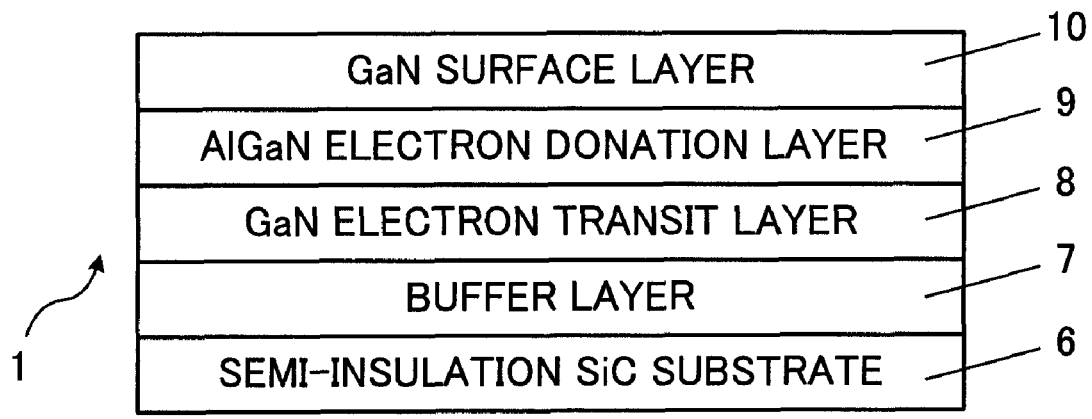
FIGS. 5A to 5H are pattern cross-section views describing a method for manufacturing the semiconductor device according to the first embodiment of the present invention.

First, as illustrated in FIG. 5A, on the semi-insulating SiC substrate 6, the buffer layer 7, the carrier transport layer 8 including GaN, the carrier supply layer 9 including AlGaN, and the surface layer 10 including GaN are, for example, sequentially epitaxially-formed by the Metal Organic Chemical Vapor Deposition (MOCVD) method, and the compound semiconductor laminated structure 1 is formed, in which a plurality of the compound semiconductor layers 7 to 10 are laminated. Meanwhile, the buffer layer 7 plays a role for preventing a lattice defect on a surface of a SiC substrate 1 from propagating to the carrier transport layer 8.

Figure 5B:
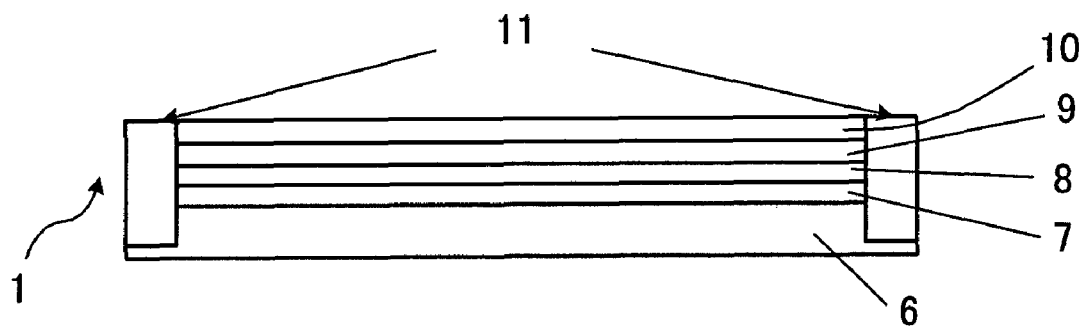

Next, as illustrated in FIG. 5B, for the purpose of deactivating an area in which an element is not formed, Ar is, for example, implanted in the non-active area, and an inter-element isolation area 11 is formed. Thereby, an active area is fixed.

Figure 5C:
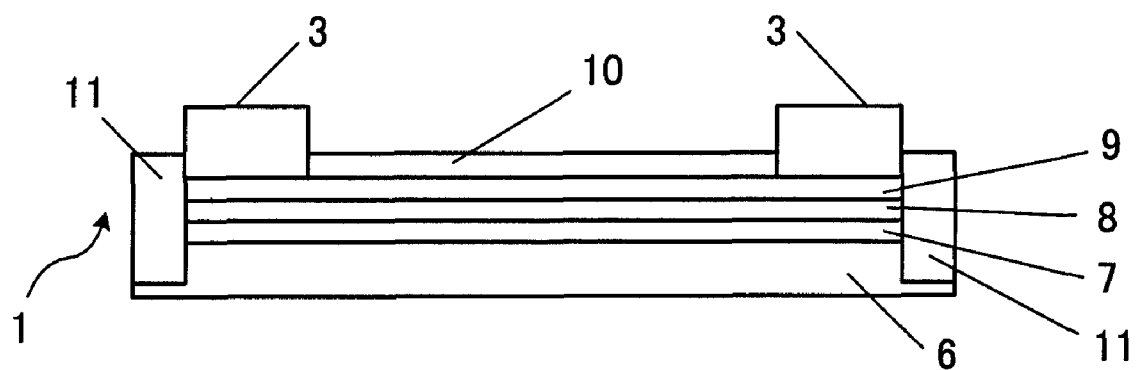

Next, as illustrated in FIG. 5C, an ohmic electrode forming area is, for example, defined by photolithography, and the surface layer 10 is, for example, eliminated by dry-etching.

As illustrated in FIG. 5C, after Ti (for example, thickness is 20 nm) and Al (for example, thickness is 200 nm) are, for example, sequentially deposited by a vacuum deposition method, and are lifted off, a pair of the ohmic electrodes 3 are formed on the carrier supply layer 9. After that, by applying a heating process, an ohmic contact is formed between the carrier supply layer 9 and the ohmic electrodes 3.

Figure 5D:
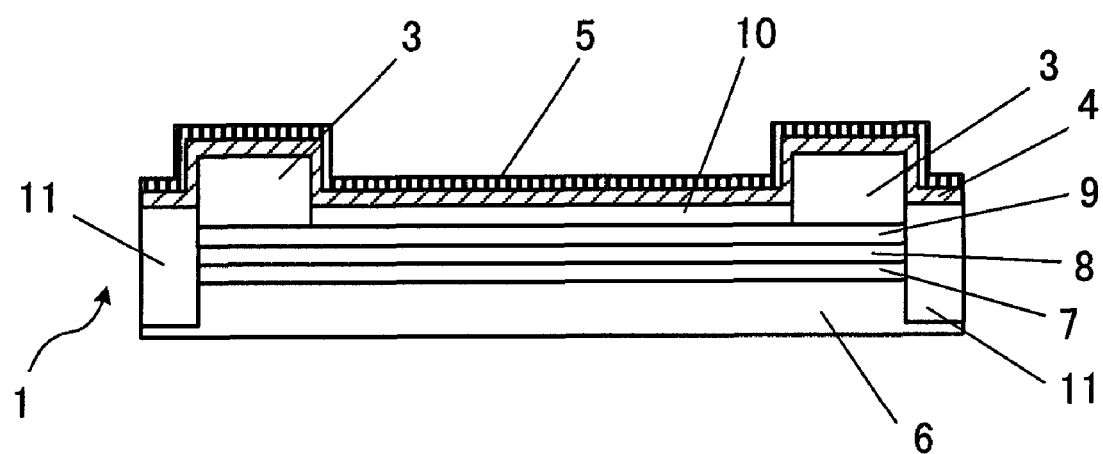

Next, as illustrated in FIG. 5D, the first insulation film 4 and the second insulation film 5 are sequentially formed so as to cover the whole surface of the compound semiconductor laminated structure 1 in which the ohmic electrodes 3 is formed.

First, as illustrated in FIG. 5D, specifically, the first insulation film 4 is formed on the surface of the compound semiconductor laminated structure 1 in which the ohmic electrodes 3 is formed, by using the plasma CVD (PCVD) method.

Here, to form the stoichiometry insulation film, whose insulation is excellent, as the first insulation film 4, a silicon nitride film, whose thickness is 20 nm, is, for example, formed by using the high frequency plasma CVD method, in which a plasma excitation frequency is 13.56 MHz, an output (high frequency output) is 50 W, and a gas flow rate is $SiH_4$/$N_2$/He=2 sccm/150 sccm/1000 sccm.

The Si—H coupling density becomes substantially $1.1 \times 10^{22}$ parts/$cm^3$, and the N—H coupling density becomes substantially $6.0 \times 10^{21}$ parts/cm³' which are included in the first insulation film 4 as formed above. Meanwhile, the Si—H coupling density and the N—H coupling density are measured by the transmission measuring using the Fourier transform infrared spectroscopic method (FT-IR). Here, the total density obtained by adding the density of the Si—H coupling and the density of the N—H couplings becomes substantially $1.7 \times 10^{22}$ parts/cm³.

The refraction index (refraction index for light with a wavelength of 633 nm) of the first insulation film 4 becomes substantially 2.0. Meanwhile, the refraction index is measured by using the ellipsometry method. Since the SiN film becomes a film in which the refraction index is 2.0 or in a range around 2.0 (that is, a range of more than 1.9 and less than 2.1), the stoichiometry, that is, the N/Si ratio becomes roughly 4/3, and the stoichiometric proportion is correct, the first insulation film 4 is formed as the stoichiometry insulation film.

Next, as illustrated in FIG. 5D, the second insulation film 5 is, for example, formed on the first insulation film 4 by using the plasma CVD (PCVD) method.

Here, to form, as the second insulation film 5, the non-stoichiometry insulation film whose stabilizing action is excellent for the compound semiconductor surface, the silicon nitride film, whose thickness is 20 nm, is, for example, formed by using the high frequency plasma CVD method, in which the plasma excitation frequency is 13.56 MHz, the output (high frequency output) is 50 W, and the gas flow rate is $SiH_4/N_2/He=3$ sccm/150 sccm/1000 sccm.

The Si—H coupling density included in the second insulation film 5 as formed above becomes substantially $1.6 \times 10^{22}$ parts/cm³, and the N—H coupling density included in the second insulation film 5 as formed above becomes substantially $4.0 \times 10^{21}$ parts/cm³. Meanwhile, the Si—H coupling density and the N—H coupling density are measured by the transmission measuring using the Fourier transform infrared spectroscopic method (FT-IR). Here, the total density obtained by adding the density of the Si—H coupling and the density of the N—H couplings becomes substantially $2.0 \times 10^{22}$ parts/cm³.

The refraction index (refraction index for light with a wavelength of 633 nm) of the second insulation film 5 becomes substantially 2.3. Meanwhile, the refraction index is measured by using the ellipsometry method. When the refraction index is outside 2.0 or a range around 2.0 (that is, a range of more than 1.9 and less than 2.1), the SiN film becomes a film in which the N/Si ratio is deviated from 4/3, and the stoichiometric proportion is not correct, so that the second SiN film 5 is formed as the non-stoichiometry insulation film.

As described above, in the present embodiment, the stoichiometry insulation film (the first insulation film) 4 is formed on a film forming condition such as the desired material gas flow rate, and the non-stoichiometry insulation film (the second insulation film) 5 is formed by changing the film forming condition such as a material gas flow rate.

That is, in a process for forming the stoichiometry insulation film as the first insulation film 4, $SiH_4$ is supplied as Si material gas, and the first insulation film (SiN film whose stoichiometric proportion is correct; stoichiometry insulation film) 4, whose N/Si ratio is 4/3, is formed, and in a process for forming the non-stoichiometry insulation film as the second insulation film 5, the flow rate of $SiH_4$, which is the Si material gas, is increased, and the second SiN film (non-stoichiometry insulation film) 5, whose N/Si ratio is less than 4/3, is formed.

Here, when the non-stoichiometry SiN film is formed, for the material gas flow rate for forming the stoichiometry SiN film, the flow rate of $SiH_4$, which is the Si material gas, may be changed, and the flow rate of $N_2$, which is the N material gas, may be changed. For example, when the flow rate of $SiH_4$, which is the Si material gas, is increased, the non-stoichiometry SiN film, in which the refraction index becomes larger, and the N/Si ratio becomes smaller, is formed. When the flow rate of $N_2$, which is the N material gas, is increased, the non-stoichiometry SiN film, in which the refraction index becomes smaller, and the N/Si ratio becomes larger, is formed.

Meanwhile, as illustrated in FIG. 5D, in the present embodiment, while the first insulation film 4 and the second insulation film 5 are formed so as to cover the whole surface of the compound semiconductor laminated structure 1 in which the pair of ohmic electrodes 3 is formed, the covering is not limited to such a case, and the first insulation film 4 and the second insulation film 5 may be formed so as to cover at least a part exposed on the surface of the compound semiconductor layers organized in the compound semiconductor laminated structure.

Figure 5E:
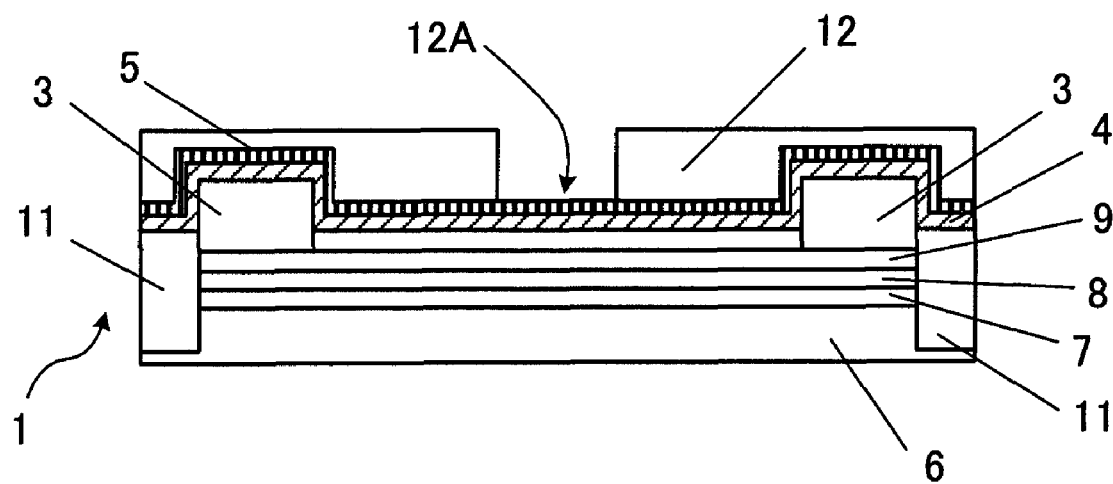

Next, as illustrated in FIG. 5E, resist 12 is applied in the whole surface, a resist aperture 12A corresponding to a gate electrode forming area is, for example, formed in the resist 12 by lithography.

Figure 5F:
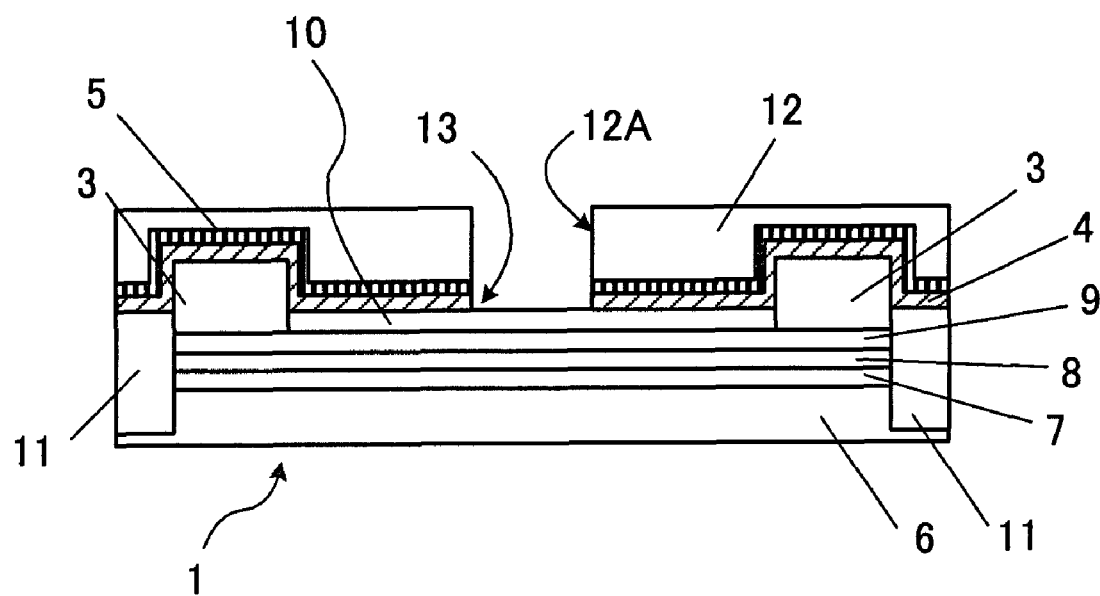

As illustrated in FIG. 5F, by using the resist 12 as a mask, and, for example, by using $SF_6$ as etching gas, the first insulation film 4 and the second insulation film 5 are dry-etched, and an aperture 13 is formed in the first insulation film 4 and the second insulation film 5.

Figure 5G:
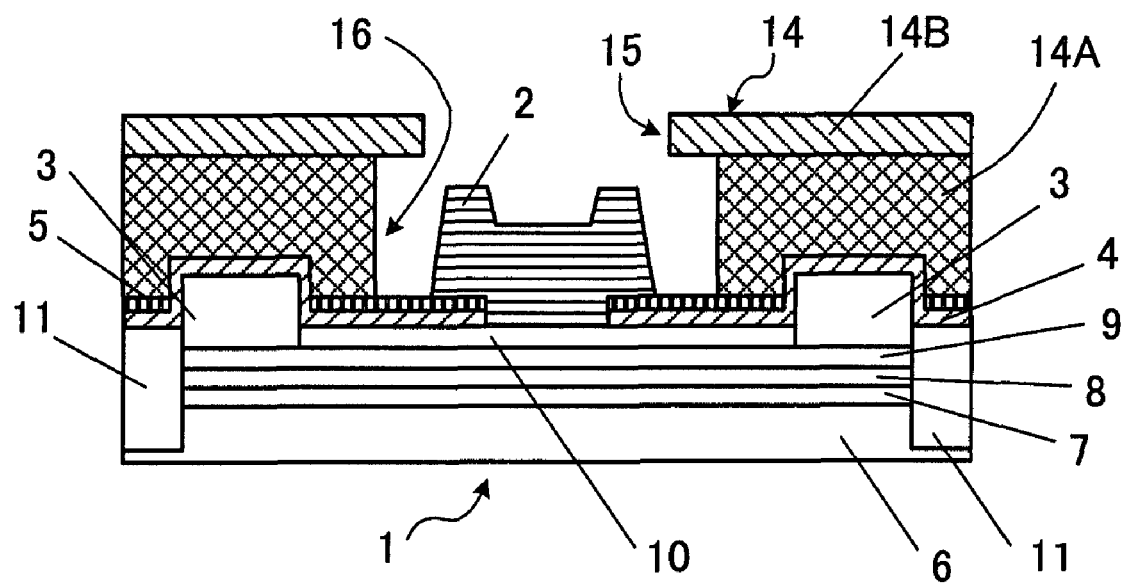

Next, as illustrated in FIG. 5G, after the resist is eliminated, a multilayer resist 14 is, for example, applied by a spin coating method, which is configured with a lower layer resist (product name PMGI: made by Microchem corp. in U.S.) 14A, and an upper layer resist (product name PFI32-A8: made by Sumitomo Chemical Co., Ltd) 14B, and an aperture 15, whose width is 0.8 μm, is, for example, formed in the upper resist 14B by ultraviolet exposing.

Next, by using the upper layer resist 14B as a mask, the lower layer resist 14A is, for example, wet-etched with alkali developer. An aperture 16 is formed in the lower layer resist 14A by this etching, and an eave structure as illustrated in FIG. 5G is formed.

Next, as illustrated in FIG. 5G, by using the upper layer resist 14B and the lower layer resist 14A as a mask, gate metal (Ni: for example, thickness around 10 nm/Au: for example, thickness around 300 nm) is deposited on the whole surface. Meanwhile, here, for convenience of illustration, it is omitted to illustrate the gate metal deposited on the upper layer resist 14B.

Figure 5H:
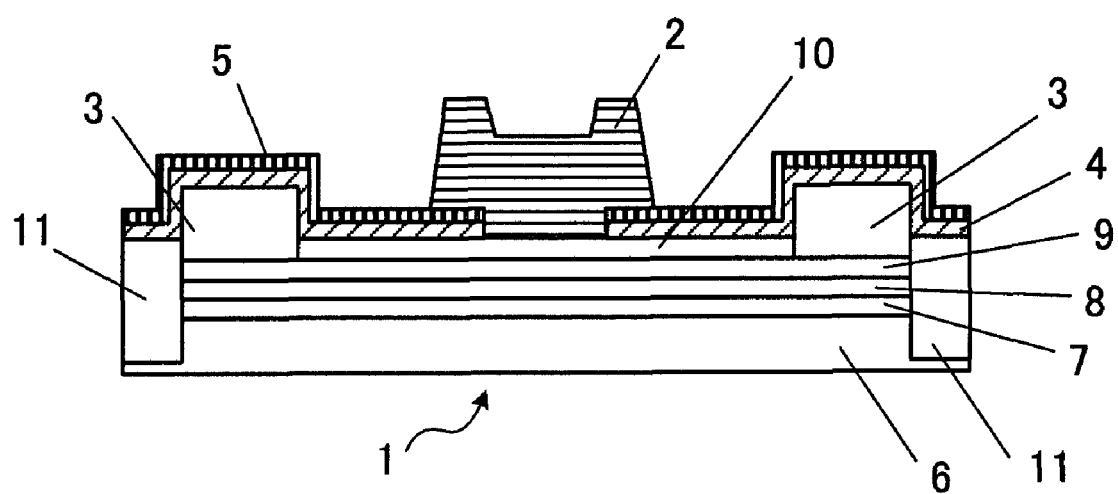

The lift off is executed by using warmed organic solvent, and as illustrated in FIG. 5H, the gate electrode 2 is formed on the surface layer 10.

After that, through a forming process for the inter-layer insulation film, a contact hole, and a variety of wirings, and the like, the present semiconductor device is completed.

Thus, in the semiconductor device and the method for manufacturing the semiconductor device according to the present embodiment, such an advantage is included that the device characteristic and the reliability can be improved.

In the compound semiconductor device provided with the first insulation film 4 and the second insulation film 5 which are formed by the above method and on the above condition, the fluctuation of drain current is suppressed, which is attributed to the trap of the compound semiconductor surface, and an amount of gate leak current which flows in the insulation film is also largely lowered, and as a result, a failure rate of the device is largely improved.

In the above embodiment, as illustrated in FIG. 2, since the first insulation film 4 and the second insulation film 5 are laminated to be the laminated structure insulation film, wherein the first insulation film 4 is caused to be the stoichiometry insulation film, and the second insulation film 5 is caused to be the non-stoichiometry film, it is possible to realize both of the following items: the insulation of the whole insulation film is improved (the gate leak current is lowered); and the chemical stability of the compound semiconductor surface is improved. In addition, since the stress is controlled, which acts on the first insulation film 4 and the second insulation film 5, it is possible to increase the device performance and the surface reforming action, to reduce the stress, and to realize the reduced stress for the whole insulation film.

Figure 6:
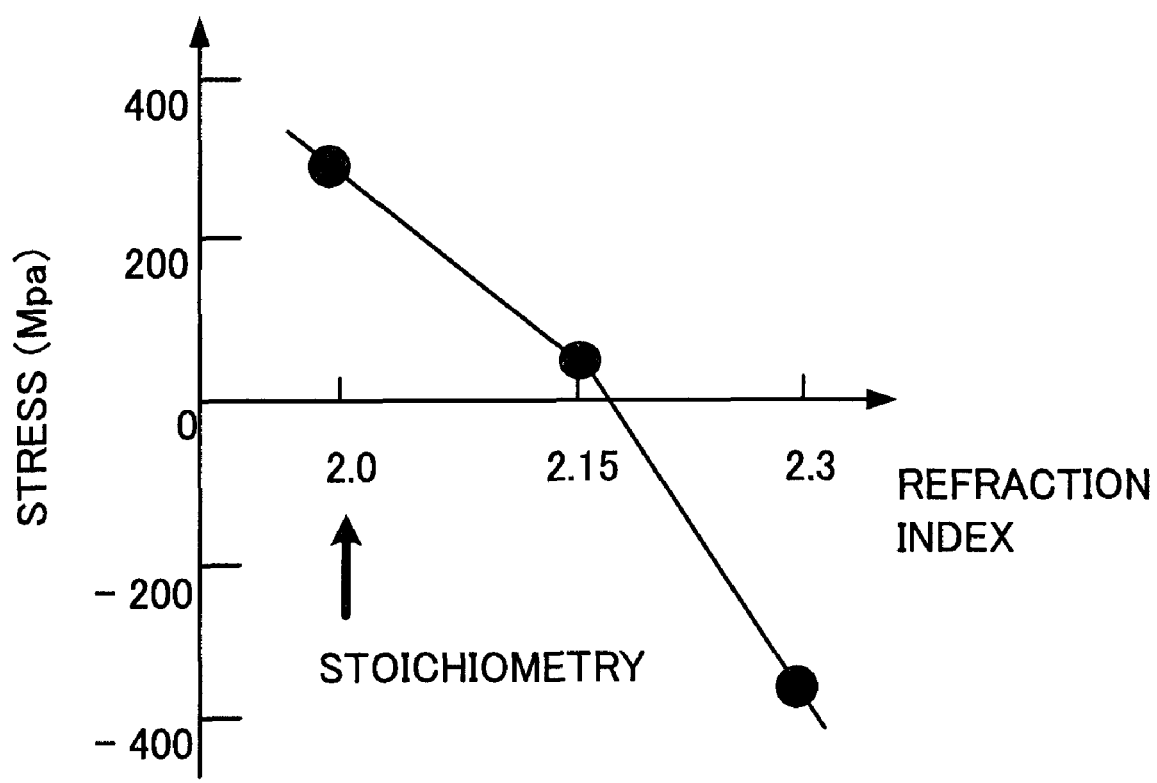
FIG. 6 is a diagram illustrating a relation between the refraction index and the stress of the SiN film which is formed by supplying N$_2$ as N material gas in the high frequency plasma CVD method.

Here, FIG. 6 is a diagram illustrating a relation between the refraction index and the stress of the SiN film which is formed by supplying $N_2$ as the N material gas in the high frequency plasma CVD method. Meanwhile, in FIG. 6, for a value of the stress in a vertical axis, a plus value corresponds to tensile stress, and a minus value corresponds to compression stress.

As illustrated in FIG. 6, in the SiN film which is formed by supplying $N_2$ as the N material gas in the high frequency plasma CVD method, when the refraction index is smaller than 2.1 or a value around 2.1 (here, smaller than 2.17), tensile stress occurs, and when the refraction index is larger than 2.1 or a value around 2.1 (here, equal to or more than 2.17), the compression stress occurs.

For example, in the above embodiment, as illustrated in FIG. 2, on the surface of the compound semiconductor laminated structure 1 in which a pair of the ohmic electrodes 3 are formed by supplying $N_2$ as the N material gas in the high frequency plasma CVD method, as the first insulation film 4, the stoichiometry SiN film is formed, whose refraction index is 2.0 or in a range around 2.0, and as the second insulation film 5, the non-stoichiometry SiN film is formed, whose refraction index is outside 2.0 or a range around 2.0.

Thus, in the above embodiment, the tensile stress acts on the stoichiometry SiN film which is formed as the first insulation film 4.

On the other hand, when the refraction index is caused to be larger than 2.1 or a range around 2.1 (here, equal to or more than 2.17), the compression stress acts on the non-stoichiometry SiN film which is formed as the second insulation film 5.

Thus, in the double layer structure insulation film formed by combining the first insulation film 4 and the second insulation film 5 on which such stresses act, by adjusting the thicknesses of the first insulation film 4 and the second insulation film 5, it is possible to reduce the stress, and realize reduced stress for the whole insulation film.

Particularly, by appropriately selecting the thicknesses of the first insulation film 4 and the second insulation film 5, it is possible to cause the stress of the whole insulation film to be zero (zero stress). As illustrated in FIG. 6, for example, when the refraction index of the first insulation film 4 as the stoichiometry insulation film is caused to be around 2.0, the refraction index of the second insulation film 5 as the non-stoichiometry insulation film is caused to be around 2.3, and the thickness of the first insulation film 4 is caused to be the same as that of the second insulation film 5, zero stress can be realized.

As described above, in the compound semiconductor device in which the stress of the whole insulation film is reduced, the first insulation film 4 is thick to the extent that the compression stress acting on the second insulation film 5 can be reduced, or the second insulation film 5 is thick to the extent that the tensile stress acting on the first insulation film 4 can be reduced. Meanwhile, in some cases, the thickness of the first insulation film 4 may be the same as that of the second insulation film 5, and in some cases, the thickness of the first insulation film 4 may not be the same as that of the second insulation film 5.

Meanwhile, in the first insulation film 4 and the second insulation film 5, which are formed on the compound semiconductor laminated structure 1, it is desirable that the stress acting on such an insulation film is not largely deviated to a compression stress side or a tensile stress side. The perfect stress reduction is not an essential condition, and a film thickness ratio between the first insulation film 4 and the second insulation film 5 can be arbitrarily selected.

Second Embodiment

The method for manufacturing the semiconductor device according to the present embodiment is different from that of the above first embodiment at least in that, in a process for forming the second insulation film, the silicon nitride film is formed by supplying $NH_3$ as the N material gas.

Figure 7:
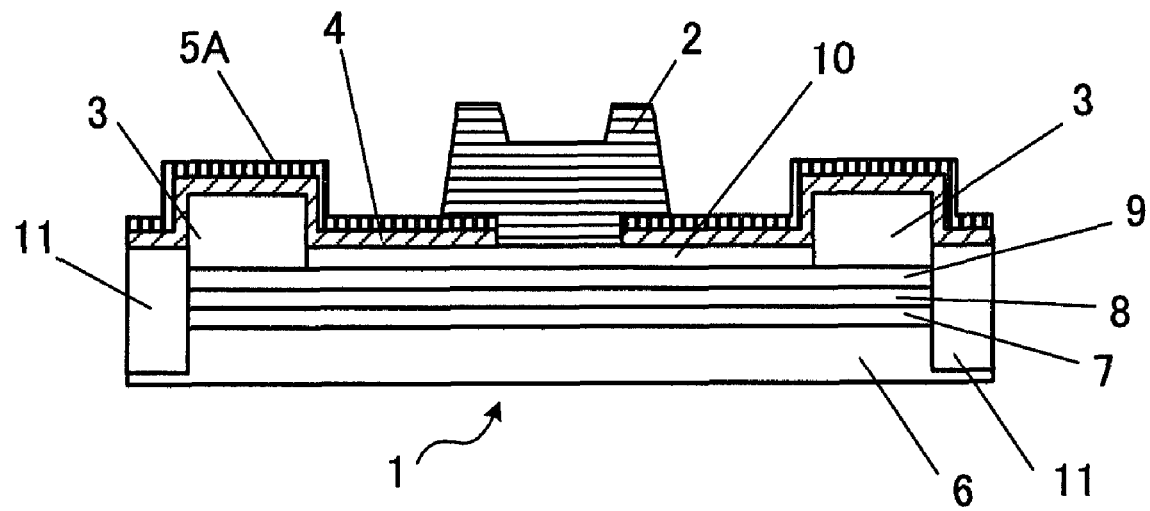
FIG. 7 is a pattern cross-section view illustrating a configuration of the semiconductor device according to a second embodiment of the present invention.

That is, in the process for forming the first insulation film 4, like the above first embodiment [refer to FIG. 5D], the silicon nitride film is formed by supplying $N_2$ as the N material gas (nitrogen material gas), on the other hand, in the process for forming the second insulation film 5A, the silicon nitride film is formed by supplying $NH_3$ as the N material gas [refer to FIG. 7].

Specifically, like the above first embodiment, to form the stoichiometry insulation film, whose insulation is excellent, as the first insulation film 4, the silicon nitride film, whose thickness is 20 nm, is, for example, formed by using the high frequency plasma CVD method, in which the plasma excitation frequency is 13.56 MHz, the output (high frequency output) is 50 W, and the gas flow rate is $SiH_4/N_2/He=2$ sccm/150 sccm/1000 sccm [refer to FIG. 7].

The Si—H coupling density becomes substantially $1.1\times 10^{22}$ parts/cm$^3$, and the N—H coupling density becomes substantially $6.0\times 10^{21}$ parts/cm$^3$, which are included in the first insulation film 4 as formed above. Meanwhile, the Si—H coupling density and the N—H coupling density are measured by the transmission measuring using the Fourier transform infrared spectroscopic method (FT-IR). Here, the total density obtained by adding the density of the Si—H coupling and the density of the N—H couplings becomes substantially $1.7\times 10^{22}$ parts/cm$^3$.

The refraction index (refraction index for light with a wavelength of 633 nm) of the first insulation film 4 becomes substantially 2.0. Meanwhile, the refraction index is measured by using the ellipsometry method.

On the other hand, the process for forming the second insulation film 5A is different from that of the above first embodiment. As the second insulation film 5A, the silicon nitride film, whose thickness is 20 nm, is, for example, formed by using the high frequency plasma CVD method, in which the plasma excitation frequency is 13.56 MHz, the output (high frequency output) is 50 W, and the gas flow rate is $SiH_4/NH_3/N_2/He=5$ sccm/10 sccm/150 sccm/1000 sccm [refer to FIG. 7].

The Si—H coupling density becomes substantially $2.4\times 10^{22}$ parts/cm$^3$, and the N—H coupling density becomes substantially $6.0\times 10^{21}$ parts/cm$^3$, which are included in the second insulation film 5A as formed above. Meanwhile, the Si—H coupling density and the N—H coupling density are measured by the transmission measuring using the Fourier transform infrared spectroscopic method (FT-IR). Here, the total density obtained by adding the density of the Si—H coupling and the density of the N—H couplings becomes substantially $3.0 \times 10^{22}$ parts/cm$^3$.

The refraction index (refraction index for light with a wavelength of 633 nm) of the second insulation film 5A becomes substantially 2.3. Meanwhile, the refraction index is measured by using the ellipsometry method. When the refraction index is outside 2.0 or a range around 2.0 (that is, a range of more than 1.9 and less than 2.1), the SiN film becomes a film in which the N/Si ratio is deviated from 4/3, and the stoichiometric proportion is not correct, so that the second insulation film 5A is formed as the non-stoichiometry insulation film.

As described above, in the present embodiment, the second insulation film 5A is formed in a condition whose hydrogen (hydrogen-terminated group; hydrogen plasma density) is increased as compared with a case that the first insulation film 4 is formed.

Meanwhile, in the process for forming the second insulation film 5A, while not only NH$_3$, but also N$_2$ is supplied as the nitrogen material gas, the process is not limited to the above case, that is, N$_2$ is not supplied, but only NH$_3$ may be supplied.

As described above, in the present embodiment, based on the following consideration, the second insulation film 5A is formed in such a condition that hydrogen plasma is excess in the plasma by using the plasma CVD (PCVD) method.

As described in the above first embodiment, since hydrogen is diffused or the radical hydrogen is implanted, it is necessary to reduce the oxide of crystal organization element and the bond which is hydrogen-terminated and is hydroxyl-terminated, or to return the oxide and the bond to be in a normal coupling condition.

Thus, in the above first embodiment, as the second insulation film 5, the non-stoichiometry insulation film is used, which includes a lot of hydrogen, and is chemically instable.

However, since hydrogen density is, for example, increased in the plasma when the second insulation film 5 is formed by the plasma CVD method, the same effect can be realized. That is, since the second insulation film 5 is formed under such a condition that a lot of the radical hydrogen is included, the chemical instability of the compound semiconductor surface can be dissolved. Since NN$_3$ is used as the nitrogen material gas, such an environment can be realized that the hydrogen density is increased in the plasma, and a lot of the radical hydrogen is included.

Meanwhile, other processes of the method for manufacturing the semiconductor device according to the present embodiment are the same as those of the above first embodiment, so that the description will be omitted here.

By the way, the semiconductor device produced by the above manufacturing method is organized as follows.

Figure 1:
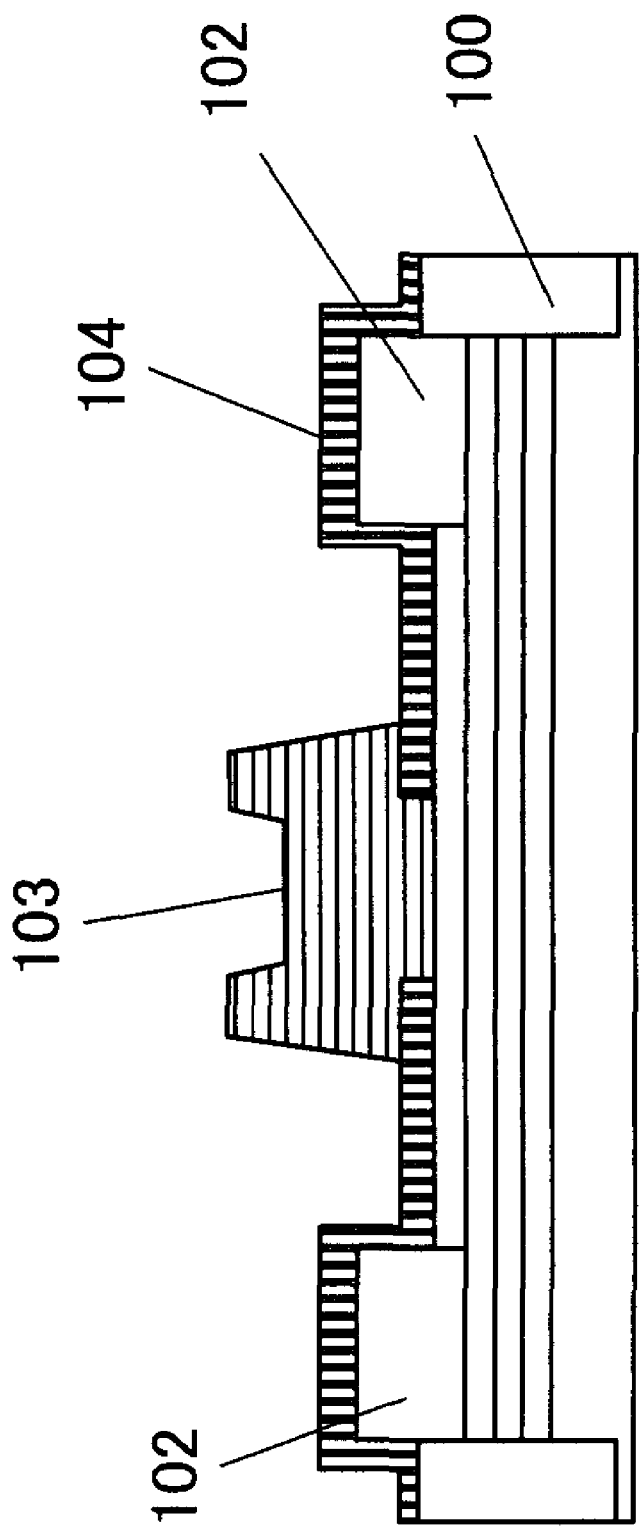
FIG. 1 is a pattern cross-section view illustrating a configuration of a conventional semiconductor device.

As illustrated in FIG. 7, in the present embodiment, the second insulation film 5A is organized as the insulation film in which the stabilizing action is excellent for the compound semiconductor surface, that is, as the non-stoichiometry insulation film in which the total of the Si—H couplings and the N—H couplings are many (the total density of the Si—H coupling density and the N—H coupling density is high), and the stoichiometric proportion is deviated (N/Si ratio is deviated from 4/3). Meanwhile, in FIG. 7, the same reference numerals are attached to the same component as that of the above first embodiment (refer to FIG. 1).

The refraction index (refraction index for light with a wavelength of 633 nm) of this second insulation film 5A is outside 2.0 or a range around 2.0 (that is, a range of more than 1.9 and less than 2.1). That is, the second insulation film 5A is organized as the insulation film whose refraction index is deviated from the stoichiometry.

In the present embodiment, the refraction index (refraction index for light with a wavelength of 633 nm) of the second insulation film 5A is caused to be outside a range of more than 1.9 and less than 2.1 (here, equal to or more than 2.1) so that the second insulation film 5A is organized as the non-stoichiometry insulation film.

Here, a character line indicating a relation between the refraction index and the Si—H coupling density and the N—H coupling density included in the SiN film formed by supplying NH$_3$ as the N material gas in the high frequency plasma CVD method is shifted to a side (upper side in FIG. 3), in which the Si—H coupling density and the N—H coupling density become higher, for the character line (refer to FIG. 3) indicating a relation between the refraction index and the Si—H coupling density and the N—H coupling density included in the SiN film formed by supplying N$_2$ as the N material gas in the high frequency plasma CVD method as described in the above first embodiment.

Thus, the density of the Si—H coupling included in the second insulation film 5A is outside $1.7 \times 10^{22}$ parts/cm$^3$ or a range around such a value (here, equal to or more than $2.0 \times 10^{22}$ parts/cm$^3$). The density of the N-H coupling included in the second insulation film 5A is outside $9.0 \times 10^{21}$ parts/cm$^3$ or a range around such a value (here, equal to or less than $8.0 \times 10^{21}$ parts/cm$^3$).

The total density obtained by adding the density of the Si—H coupling and the density of the N—H coupling which are included in the second insulation film 5A is equal to or more than $2.8 \times 10^{22}$ parts/cm$^3$ (the total density may be at least equal to or more than $2.0 \times 10^{22}$ parts/cm$^3$). That is, the second insulation film 5A is the highly hydrogen including insulation film in which the total density obtained by adding the density of the Si—H coupling and the density of the N—H coupling is high, and a lot of hydrogen is included. As described above, the second insulation film 5A is organized as the insulation film in which more hydrogen is included than that of the first insulation film 4, and an amount of included hydrogen is large.

The second insulation film 5A organized above includes a lot of hydrogen, herein hydrogen is coupled to Si or N, and the chemical stability is degraded as compared with the stoichiometry SiN film (Si$_3$N$_4$ film) whose N/Si ratio is 4/3.

Meanwhile, while the refraction index of the second insulation film 5A is caused to be higher than 2.0 or a range around 2.0, the refraction index is not limited to such a value, and may also be lower than 2.0 or a range around 2.0 (that is, equal to or less than 1.9). In this case, the density of the N—H coupling included in the second insulation film 5A becomes equal to or more than $1.5 \times 10^{22}$ parts/cm$^3$ (outside $9.0 \times 10^{21}$ parts/cm$^3$ or a range around such a value). The density of the Si—H coupling becomes equal to or less than $1.1 \times 10^{22}$ parts/cm$^3$ (outside $1.7 \times 10^{22}$ parts/cm$^3$ or a range around such a value). In addition, the total density obtained by adding the density of the Si—H coupling and the density of the N—H coupling becomes equal to or more than $2.7 \times 10^{22}$ parts/cm$^3$ (the total density may be at least equal to or more than $2.0 \times 10^{22}$ parts/cm$^3$).

Meanwhile, since other organizations are the same as those of the above first embodiment, the description will be omitted here.

Thus, according to the semiconductor device and the method for manufacturing the semiconductor device according to the present embodiment, like the above first embodiment, such an advantage is included that it is possible to improve the device characteristic and to suppress the performance fluctuation.

Particularly, according to the method for manufacturing the semiconductor device according to the present embodiment, the reforming action (stabilizing action) for the denaturalized compound semiconductor surface is performed not only by the Si—H coupling and the N—H coupling which are included in the formed second insulation film 5A, but also is realized by hydrogen plasma included in the plasma while the second insulation film 5A is being formed. Thus, it is possible to further improve the chemical stability of the compound semiconductor surface and the device characteristic.

In the compound semiconductor device provided with the first insulation film 4 and the second insulation film 5A which are formed by the above method and on the above condition, the fluctuation of the drain current is suppressed, which is attributed to the trap of the compound semiconductor surface, and an amount of the gate leak current which flows in the insulation film is also largely lowered, and as a result, the failure rate of the device is largely improved.

Meanwhile, when the method for manufacturing the semiconductor device according to the present embodiment is used, since the reforming action (stabilizing action) for the compound semiconductor surface is also realized by the hydrogen plasma included in the plasma while the second insulation film 5A is being formed, unlike the above embodiment, as the second insulation film 5A, it is not necessary to form the non-stoichiometry insulation film (insulation film whose refraction index is deviated from the stoichiometry) in which a lot of hydrogen is included, and the stabilizing action is excellent for the compound semiconductor surface. That is, no restriction is included in the refraction index of the second insulation film 5A, and the refraction index (refraction index for light with a wavelength of 633 nm) of the SiN film as the second insulation film 5A is caused to be 2.0 or in a range around 2.0 (that is, a range of more than 1.9 and less than 2.1), and as the second insulation film, the insulation film may be also formed, in which a lot of hydrogen is included, and the refraction index is positioned at the stoichiometry.

In this case, the density of the Si—H coupling included in the second insulation film may become $1.7 \times 10^{22}$ parts/cm$^3$ or in a range around such a value (here, a range of more than $1.1 \times 10^{22}$ parts/cm$^3$ and less than $2.0 \times 10^{22}$ parts/cm$^3$). The density of the N—H coupling may become $9.0 \times 10^{21}$ parts/cm$^3$ or in a range around such a value (here, a range of more than $8.0 \times 10^{21}$ parts/cm$^3$ and less than $1.5 \times 10^{22}$ parts/cm$^3$). In addition, the total density obtained by adding the density of the Si—H coupling and the density of the N—H coupling may become equal to or more than $2.6 \times 10^{22}$ parts/cm$^3$ (at least equal to or more than $2.0 \times 10^{22}$ parts/cm$^3$).

Thereby, as compared with such a case that the insulation film is formed in which the refraction index is positioned at the non-stoichiometry, it is possible to increase the insulation of the whole insulation film, and to realize an insulation film whose insulation is more excellent. However, when the insulation film is realized, in which the stabilizing action is more excellent for the compound semiconductor surface, like the above embodiment, it is preferable to form the insulation film in which the refraction index is positioned at the non-stoichiometry.

Third Embodiment

Next, the semiconductor device and the method for manufacturing the semiconductor device according to a third embodiment of the present invention will be described.

Figure 8:
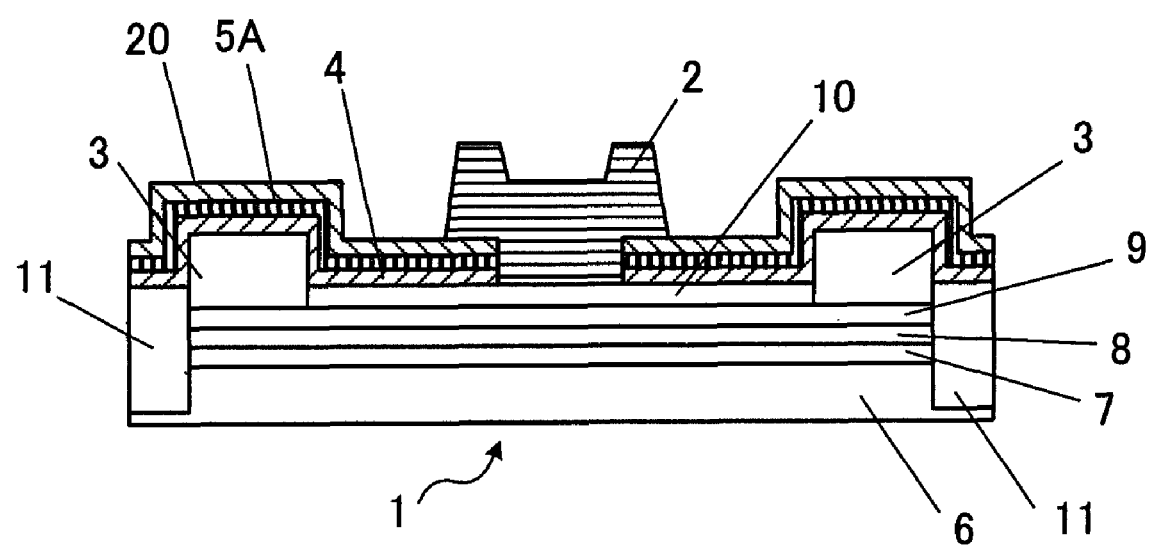
FIG. 8 is a pattern cross-section view illustrating a configuration of the semiconductor device according to a third embodiment of the present invention.

As illustrated in FIG. 8, the semiconductor device according to the present embodiment is different from that of the above second embodiment in that a third insulation film 20 is further provided on the second insulation film 5A. Meanwhile, in FIG. 8, the same reference numerals are utilized for the same component as those of the above second embodiment (refer to FIG. 7).

In the above second embodiment, as the second insulation film 5A, the insulation film [the SiN film whose refraction index (refraction index for light with a wavelength of 633 nm) is outside 2.0 or a range around 2.0 (that is, a range of more than 1.9 and less than 2.1)] is formed, in which a lot of hydrogen is included, and the refraction index is positioned at the non-stoichiometry.

In this case, the second insulation film 5A becomes the insulation film in which tensile stress occurs because of the physical characteristic (a relation between the stress and the refraction index of the SiN film formed by supplying NH$_3$ as the N material gas in the high frequency plasma CVD method; characteristic which is wholly shifted from the characteristic illustrated in FIG. 6 to an upper side (a tensile side)).

On the other hand, the stoichiometry SiN film formed as the first insulation film 4 also becomes an insulation film in which tensile stress occurs because of its physical characteristic (refer to FIG. 6).

Thus, as illustrated in FIG. 8, in the present semiconductor device, to reduce the stress of the whole insulation film, and to realize the reduced stress of the whole insulation film, the third insulation film (here, the silicon nitride film) 20 is provided on the second insulation film 5A, on which compression stress acts, which can reduce the tensile stress acting on the first insulation film 4 and the tensile stress acting on the second insulation film 5A. Thereby, the whole insulation film can be caused to be in the condition of zero stress.

The third insulation film 20, on which such a compression stress acts, can be, for example, formed by the plasma excited by a low frequency RF (380 kHz) (that is, by the low frequency plasma CVD method).

Meanwhile, since other organizations are the same as those of the above second embodiment and the modified embodiment, the description will be omitted here.

The first insulation film 4, the second insulation film 5A, and the third insulation film 20, which are provided in the semiconductor device organized above, can be produced by the following method.

First, to form the stoichiometry insulation film, whose insulation is excellent, as the first insulation film 4, the silicon nitride film, whose thickness is 10 nm, is, for example, formed by using the high frequency plasma CVD method, in which the plasma excitation frequency is 13.56 MHz, the output (high frequency output) is 50 W, and the gas flow rate is SiH$_4$/N$_2$/He=2 sccm/150 sccm/1000 sccm [refer to FIG. 8].

The Si—H coupling density becomes substantially $1.1 \times 10^{22}$ parts/cm$^3$, and the N—H coupling density becomes substantially $6.0 \times 10^{21}$ parts/cm$^3$, which are included in the first insulation film 4 as formed above. Meanwhile, the Si—H coupling density and the N—H coupling density are measured by the transmission measuring using the Fourier transform infrared spectroscopic method (FT-IR). Here, the total density obtained by adding the density of the Si—H coupling and the density of the N—H couplings becomes substantially $1.7 \times 10^{22}$ parts/cm$^3$.

The refraction index (refraction index for light with a wavelength of 633 nm) of the first insulation film 4 becomes substantially 2.0. Meanwhile, the refraction index is measured by using the ellipsometry method.

As described above, in the process for forming the first insulation film 4, the first insulation film 4 is formed as the stoichiometry insulation film in which in such a range that the refraction index for light with a wavelength of 633 nm is more than 1.9 and less than 2.1 (that is, the refraction index is 2.0 or in a range around 2.0), the N/Si ration is 4/3, and the stoichiometric proportion is correct. As described above, the first insulation film 4, which is formed by using $N_2$ as the nitrogen material gas in the high frequency plasma CVD method, becomes a film in which tensile stress occurs.

Next, to form the second insulation film 5A on the first insulation film 4, the silicon nitride film, whose thickness is 10 nm, is, for example, formed by using the high frequency plasma CVD method, in which the plasma excitation frequency is 13.56 MHz, the output (high frequency output) is 50 W, and the gas flow rate is $SiH_4/NN_3/N_2/He=5$ sccm/10 sccm/150 sccm/1000 sccm [refer to FIG. 8].

The Si—H coupling density becomes substantially $2.4 \times 10^{22}$ parts/$cm^3$, and the N—H coupling density becomes substantially $6.0 \times 10^{21}$ parts/$cm^3$, which are included in the second insulation film 5A as formed above. Meanwhile, the Si—H coupling density and the N—H coupling density are measured by the transmission measuring using the Fourier transform infrared spectroscopic method (FT-IR). Here, the total density obtained by adding the density of the Si—H coupling and the density of the N—H couplings becomes substantially $3.0 \times 10^{22}$ parts/$cm^3$.

The refraction index (refraction index for light with a wavelength of 633 nm) of the second insulation film 5A becomes substantially 2.3. Meanwhile, the refraction index is measured by using the ellipsometry method. Here, since the second insulation film 5A is formed by using $NH_3$ as the nitrogen material gas in the high frequency plasma CVD method, tensile stress occurs even when the refraction index is substantially 2.3.

As described above, in the process for forming the second insulation film 5A, the second insulation film 5A is formed as the non-stoichiometry insulation film in which, outside such a range that the refraction index for light with a wavelength of 633 nm is more than 1.9 and less than 2.1 (that is, the refraction index is 2.0 or in a range around 2.0), the stoichiometric proportion is deviated (the N/Si ration is deviated from 4/3). As described above, the second insulation film 5A, which is formed by using $NH_3$ as the nitrogen material gas in the high frequency plasma CVD method, becomes a film in which tensile stress occurs.

Next, to form the third insulation film 20 on the second insulation film 5A, the silicon nitride film, whose thickness is 20 nm, is, for example, formed by using the low frequency plasma CVD method, in which the plasma excitation frequency is 380 kHz, the output (low frequency output) is 50 W, and the gas flow rate is $SiH_4/N_2/He=10$ sccm/500 sccm/1000 sccm [refer to FIG. 8].

The Si—H coupling density becomes substantially $0.8 \times 10^{22}$ parts/$cm^3$, and the N—H coupling density becomes substantially $3.0 \times 10^{21}$ parts/$cm^3$, which are included in the third insulation film 20 as formed above. Meanwhile, the Si—H coupling density and the N—H coupling density are measured by the transmission measuring using the Fourier transform infrared spectroscopic method (FT-IR). Here, the total density obtained by adding the density of the Si—H coupling and the density of the N—H couplings becomes substantially $3.1 \times 10^{22}$ parts/$cm^3$.

The refraction index (refraction index for light with a wavelength of 633 nm) of the third insulation film 20 becomes substantially 2.0. Meanwhile, the refraction index is measured by using the ellipsometry method.

In addition, a film density of the third insulation film 20 becomes 2.9 to 3.0 g/$cm^3$. That is, as compared with the first insulation film 4 or the second insulation film 5A, the film density of the third insulation film 20 is higher (here, around 10%).

The third insulation film 20, which is formed as described above in the low frequency plasma CVD method, becomes a film in which compression stress occurs.

As described above, the third insulation film 20 deposited by the low frequency plasma CVD method becomes a film which is precise, and whose coupling defects are few since the ion energy is high when the film is formed. Thus, the third insulation film 20 is excellent for water resistance, and largely contributes to improve the device reliability. That is, the semiconductor device can be realized, which includes higher water resistance than that of the semiconductor device provided with only the insulation film (SiN film) formed by the high frequency plasma CVD method (plasma excitation frequency 13.56 MHz).

Meanwhile, since other processes of the method for manufacturing the semiconductor device according to the present embodiment are the same as those of the above second embodiment and the modified example, the description will be omitted here.

Thus, according to the semiconductor device and the method for manufacturing the semiconductor device according to the present embodiment, like the semiconductor device and the method for manufacturing the semiconductor device of the above second embodiment and the modified example, such an advantage is included that it is possible to improve the device characteristic and the reliability.

According to the method for manufacturing the semiconductor device according to the present embodiment, like the manufacturing method of the above second embodiment and the modified example, the reforming action (stabilizing action) for the denaturalized compound semiconductor surface is performed not only by the Si—H coupling and the N—H coupling which are included in the formed second insulation film 5A, but also is realized by the hydrogen plasma included in the plasma while the second insulation film 5A is being formed. Thus, it is possible to further improve the chemical stability of the compound semiconductor surface and the device characteristic.

In the compound semiconductor device provided with the first insulation film 4, the second insulation film 5A, and the third insulation film 20 which are formed by the above method and on the above condition, the fluctuation of the drain current is suppressed, which is attributed to the trap of the compound semiconductor surface, and an amount of the gate leak current flowed in the insulation film is also lowered, and as a result, the failure rate of the device is largely improved.

Particularly, according to the semiconductor device and the method for manufacturing the semiconductor device according to the present embodiment, it is possible to improve the insulation of the whole insulation film (to reduce the gate leak current), and to improve the chemical stability of the compound semiconductor surface with the first insulation film 4, the second insulation film 5A, and also, it is possible to realize reduced stress for the whole insulation film with the third insulation film 20.

Modified Example

Figure 11A:
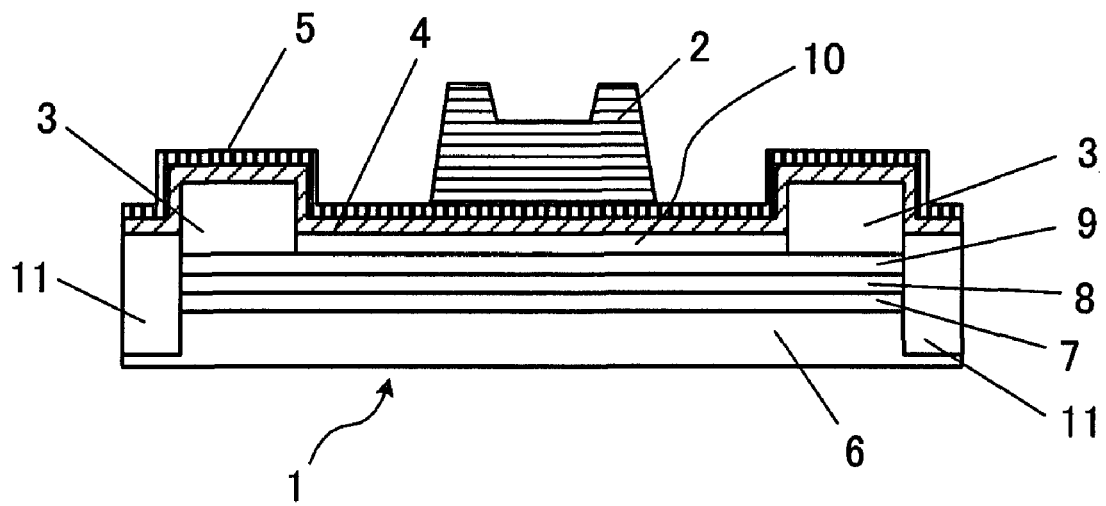
FIGS. 11A and 11B are pattern cross-section views illustrating the semiconductor device according to the modified example of the first embodiment of the present invention.
Figure 11B:
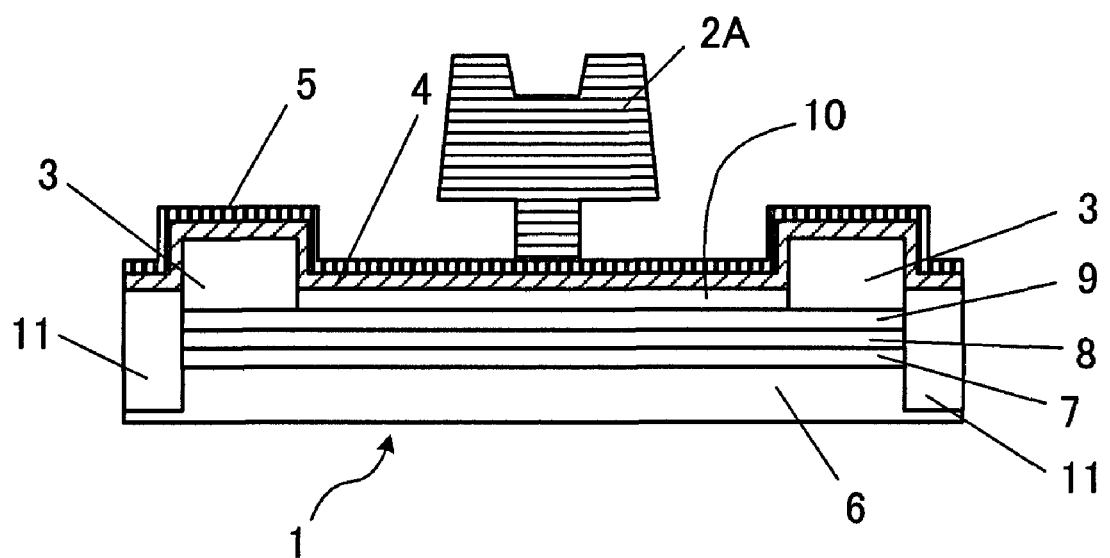

Meanwhile, while each of the above embodiments is described by using the Schottky gate FET as an example, the present invention can also be applied to other semiconductor devices such as the MIS gate FET (for example, refer to FIGS. 11A and 11B). In the Schottky gate FET of each of the above embodiments, and the MIS gate FET, according to a variety of requested characteristics, the compound semiconductor laminated structure can also be organized so as not to be provided with the GaN surface layer.

Figure 9A:
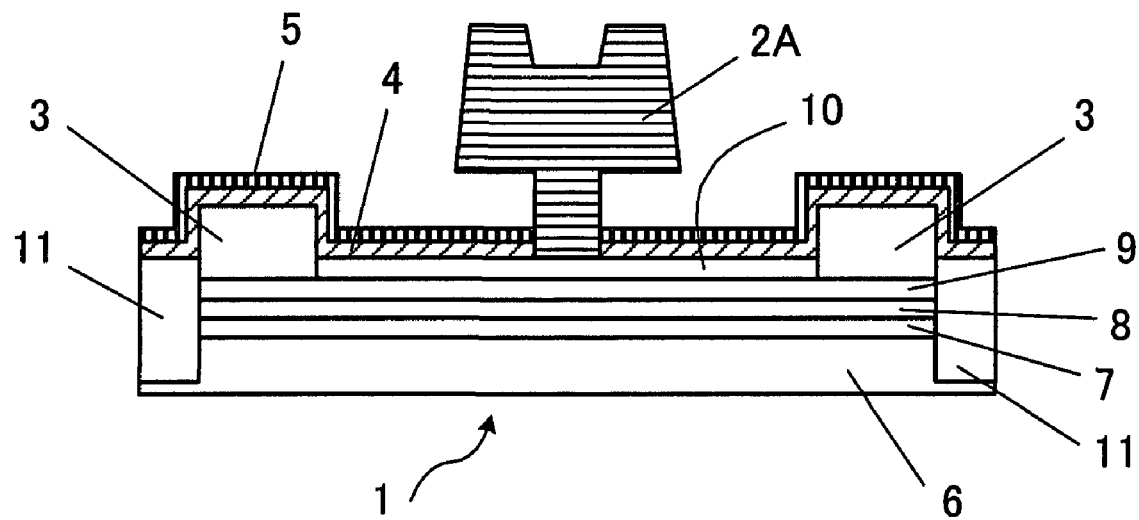
FIGS. 9A to 9C are pattern cross-section views illustrating a configuration of the semiconductor device according to a modified example of each embodiment of the present invention.
Figure 9B:
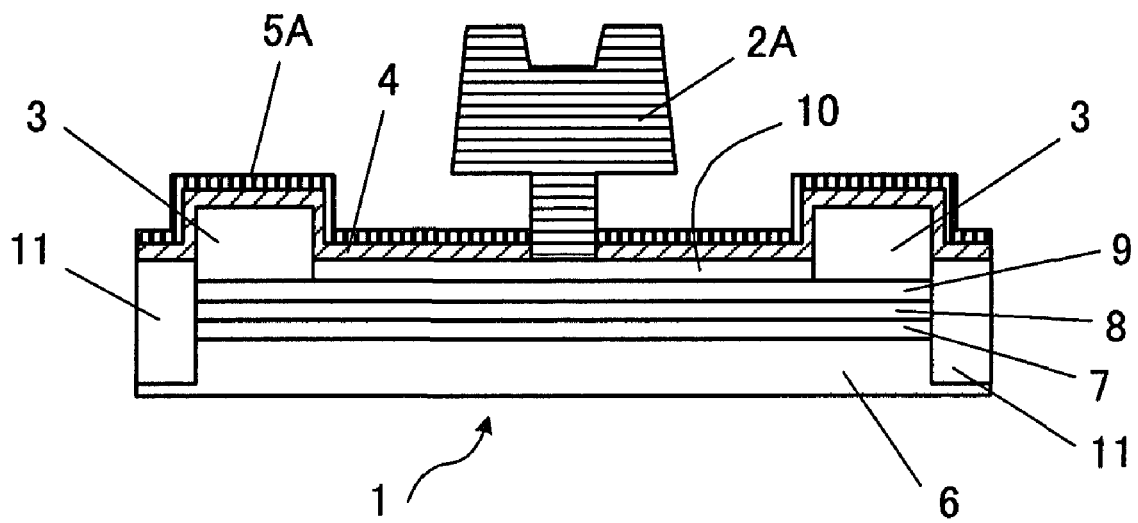
Figure 9C:
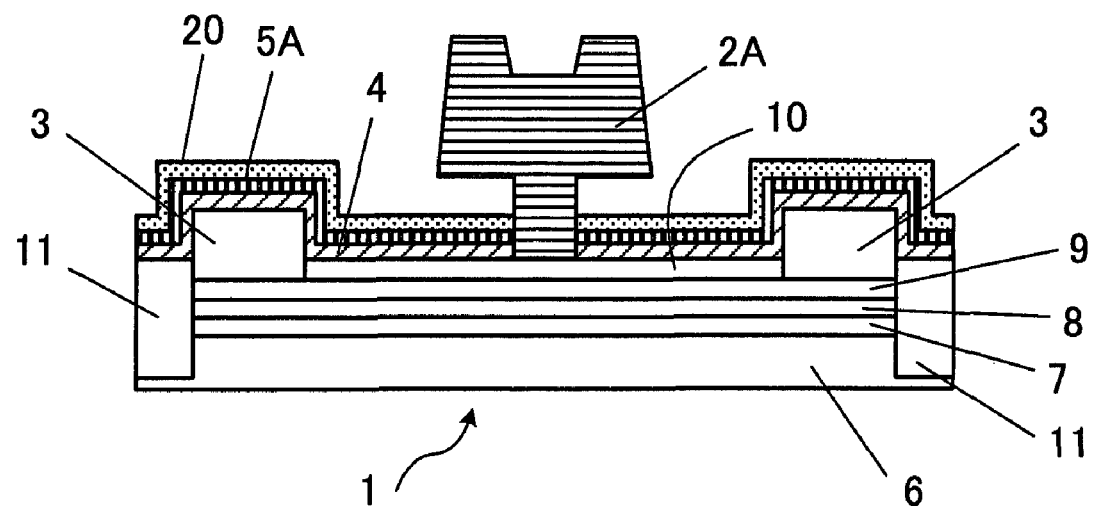

A shape of the gate electrode provided in the semiconductor device of each of the above embodiments and each modified example is not limited to that of each of the above embodiments and each modified example. For example, as illustrated in FIGS. 9A to 9C, the semiconductor device of each of the above embodiments and each modified example can also be organized so as to be provided with a mushroom-type gate electrode 2A. Meanwhile, FIG. 9A illustrates a modified example of the above first embodiment (refer to FIG. 2), FIG. 9B illustrates a modified example of the above second embodiment (refer to FIG. 7), and FIG. 9C illustrates a modified example of the above third embodiment (refer to FIG. 8).

The semiconductor device provided with such a mushroom-type gate electrode 2A can be produced as follows.

While such a case will be described that the semiconductor device is produced whose structure is illustrated in FIG. 9A, the semiconductor devices whose structures are illustrated in FIGS. 9B and 9C can be also produced by the same method but incorporating the features for the second and third embodiments as described above.

First, like the above first embodiment [refer to FIGS. 5A to 5D], the compound semiconductor laminated structure 1 is formed, the inter-element isolation is executed, the pair of ohmic electrodes 3 is formed, and the first insulation film 4 and the second insulation film 5 are formed.

Figure 10A:
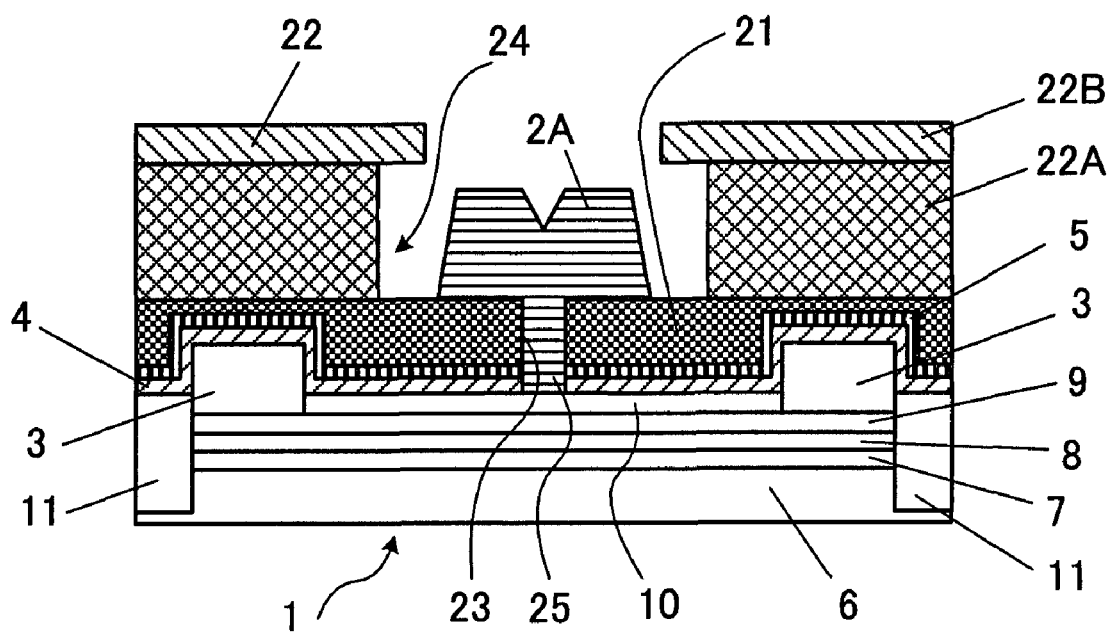
FIGS. 10A and 10B are pattern cross-section views describing a method for manufacturing the semiconductor device according to a modified example of the first embodiment of the present invention.

Next, as illustrated in FIG. 10A, a fine gate resist 21, which is a positive-type electron beam resist (product name ZEP520-A7; made by ZEON CORPORATION), is, for example, applied by the spin coating method so that the thickness becomes, for example, around 300 nm, and is, for example, thermally processed at 180° C. for five minutes.

Next, as illustrated in FIG. 10A, a multilayer resist (eave forming multilayer resist) 22 organized with a lower layer resist 22A and an upper layer resist 22B is formed.

That is, first, the lower layer resist 22A, which is alkali soluble resin (product name PMGI: made by Microchem corp. in U.S.), is, for example, applied by the spin coating method so that the thickness becomes, for example, around 500 nm, and is, for example, thermally processed at 180° C. for three minutes.

Next, on the lower layer resist 22A, the upper layer resist 22B, which is the positive-type electron beam resist (product name ZEP520-A7; made by ZEON CORPORATION), is, for example, applied by the spin coating method so that the thickness becomes, for example, around 200 nm, and is, for example, thermally processed at 180° C. for two minutes.

Next, as illustrated in FIG. 10A, by the electron beam lithography, in a side of the substrate 6, a fine gate aperture 23, and a lift off eave-shape over gate aperture 24 are formed.

Next, as illustrated in FIG. 10A, the first insulation film 4 and the second insulation film 5 are etched through the fine gate aperture 23, an aperture (gate aperture) 25 is formed in the first insulation film 4 and the second insulation film 5, and after that, gate metal [electrode metal; Ni (thickness 10 nm)/Au (thickness 300 nm)] is deposited on the whole surface by using, as a mask, the upper layer resist 22B, the lower layer resist 22A, and the fine gate resist 21. Meanwhile, for convenience of the illustration, the gate metal deposited on the upper layer resist 22B is omitted.

Figure 10B:
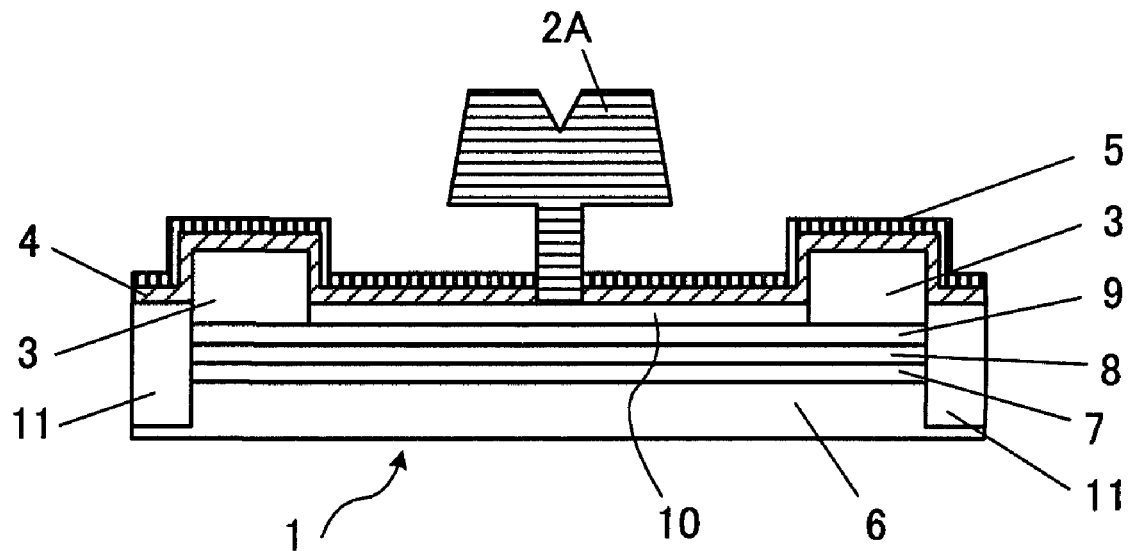

Next, the lift off is executed by using warmed organic solvent, and as illustrated in FIG. 10B, the mushroom-type gate electrode 2A is formed on the compound semiconductor laminated structure 1. As described above, since the gate electrode 2A is caused to be the mushroom-shape in which a lower part (stalk part) is narrower than the upper part (pileus part), the semiconductor device, whose high frequency characteristic is excellent, can be realized.

Figure 10C:
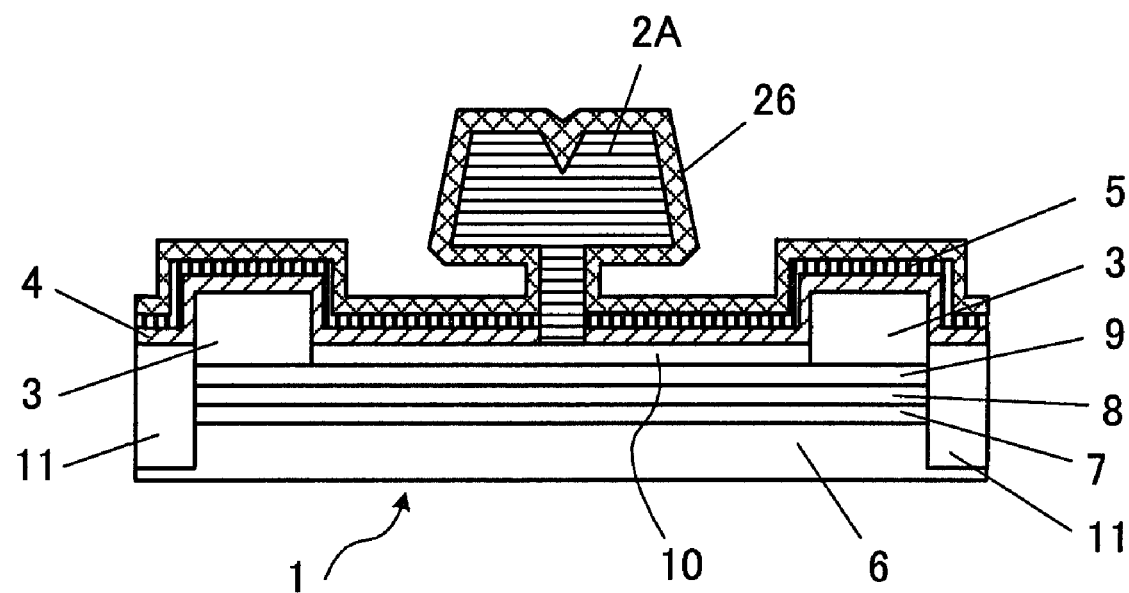
FIG. 10C is a pattern cross-section view illustrating other exemplary configurations of the semiconductor device illustrated in FIGS. 10A and 10B.

In addition, according to the necessity, as illustrated in FIG. 10C, another insulation film (for example, SiN film) 26 is formed so as to cover the whole surface of the compound semiconductor laminated structure 1 including the gate electrode 2A. Thereby, since the whole compound semiconductor laminated structure 1 is covered by insulation film 26, the reliability such as moisture resistance is improved.

After that, through a forming process for the inter-layer insulation film, the contact hole, and a variety of wirings, and the like, the semiconductor device is completed.

While the compound semiconductor laminated structure organizing the semiconductor device of each of the above embodiments and each example is organized with GaN-based compound semiconductor material, the organization is not limited to such a case. For example, the compound semiconductor laminated structure can be also organized with InP-based compound semiconductor material. In this case, the compound semiconductor laminated structure may be, for example, organized so that the buffer layer, an InGaAs carrier transport layer, an InAlAs carrier supply layer, an InP etching stopper layer, and an InGaAs low resistance layer are sequentially laminated on a semi-insulation InP substrate.

The present invention is not limited to each of the above embodiments and each of the above modified examples, and a variety of modifications and changes can be implemented without departing from the concept of the present invention.

What is claimed is:

1. A semiconductor device, comprising:
a compound semiconductor laminated structure including a plurality of compound semiconductor layers formed over a semiconductor substrate;
a first insulation film covering at least a part of a surface of the compound semiconductor laminated structure, and the first insulation film is stoichiometrically balanced; and
a second insulation film formed on the first insulation film, wherein
the second insulation film includes more hydrogen than the first insulation film.

2. The semiconductor device according to claim 1, wherein the first insulation film is a silicon nitride film, and a density of an Si—H coupling is about $1.1 \times 10^{22}$ parts/cm$^3$.

3. The semiconductor device according to claim 1, wherein the first insulation film is the silicon nitride film, and a refraction index for light with a wavelength of 633 nm is more than 1.9 and less than 2.1.

4. The semiconductor device according to claim 1, wherein the second insulation film is not stoichiometrically balanced.

5. The semiconductor device according to claim 4, wherein the second insulation film is a silicon nitride film, and a density of an Si—H coupling is greater or lesser than about $1.1 \times 10^{22}$ parts/cm$^3$.

6. The semiconductor device according to claim 4, wherein the second insulation film is the silicon nitride film, and a density of an Si—H coupling is greater or lesser than about $1.7 \times 10^{22}$ parts/cm$^3$.

7. The semiconductor device according to claim 4, wherein the second insulation film is a silicon nitride film, and the second insulation film has a refraction index for light with a wavelength of 633 nm equal to or more than 2.1.

8. The semiconductor device according to claim 4, wherein the second insulation film is a silicon nitride film, and a density of an N—H coupling of said second insulation film is equal to or more than $1.0 \times 10^{22}$ parts/cm$^3$.

9. The semiconductor device according to claim 4, wherein the second insulation film is a silicon nitride film, and a density of an N—H coupling of said second insulation film is equal to or more than $1.5 \times 10^{22}$ parts/cm$^3$.

10. The semiconductor device according to claim 4, wherein
the second insulation film is a silicon nitride film, and the second insulation film has a refraction index for light with a wavelength of 633 nm equal to or less than 1.9.

11. The semiconductor device according to claim 1, wherein
the second insulation film is stoichiometrically balanced.

12. The semiconductor device according to claim 11, wherein
the second insulation film is a silicon nitride film, and the second insulation film has a refraction index for light with a wavelength of 633 nm more than 1.9 and less than 2.1.

13. The semiconductor device according to claim 1, wherein
the first insulation film has a tensile stress, and
the second insulation film has a compression stress.

14. The semiconductor device according to claim 1, further comprising:
a third insulation film formed on the second insulation film, wherein
the first insulation film has a tensile stress,
the second insulation film has a tensile stress, and
the third insulation film has a compression stress.

15. A method for manufacturing a semiconductor device, comprising:
forming a compound semiconductor laminated structure by laminating a plurality of compound semiconductor layers over a semiconductor substrate;
forming a first insulation film covering at least a part of a surface of the compound semiconductor laminated structure, and the first insulation film is stoichiometrically balanced; and
forming a second insulation film formed on the first insulation film, the second insulation film including a larger amount of hydrogen than the first insulation film.

16. The method for manufacturing the semiconductor device according to claim 15, wherein
the first insulation film is formed by supplying SiH$_4$ as Si material gas to form a silicon nitride film, a N/Si ratio of which is 4/3,
the second insulation film is formed by increasing a flow rate of the SiH$_4$ to form the silicon nitride film, the N/Si ratio of which is less than 4/3.

17. The method for manufacturing the semiconductor device according to claim 15, wherein
the first insulation film is formed by supplying N$_2$ as N material gas to form a first silicon nitride film,
the second insulation film is formed by supplying gas including NH$_3$ as the N material gas to form a second silicon nitride film.

18. The method for manufacturing the semiconductor device according to claim 17, further comprising:
forming a third insulation film on the second insulation film by a low frequency excitation plasma CVD method.

* * * * *